(12) United States Patent
Kim

(10) Patent No.: US 11,910,648 B2
(45) Date of Patent: Feb. 20, 2024

(54) THIN FILM TRANSISTOR SUBSTRATE, DISPLAY APPARATUS, AND METHOD OF MANUFACTURING THE THIN FILM TRANSISTOR SUBSTRATE

(71) Applicant: Samsung Display Co., Ltd., Yongin-Si (KR)

(72) Inventor: Keunwoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 17/411,870

(22) Filed: Aug. 25, 2021

(65) Prior Publication Data
US 2022/0173188 A1 Jun. 2, 2022

(30) Foreign Application Priority Data
Nov. 27, 2020 (KR) .................... 10-2020-0162678

(51) Int. Cl.
*H01L 27/14* (2006.01)
*H10K 59/121* (2023.01)
(Continued)

(52) U.S. Cl.
CPC ..... *H10K 59/1213* (2023.02); *H10K 59/1216* (2023.02); *H01L 27/1222* (2013.01);
(Continued)

(58) Field of Classification Search
CPC .......... H10K 59/1213; H10K 59/1216; H10K 59/1201; H01L 27/1222; H01L 27/1255;
(Continued)

(56) References Cited

U.S. PATENT DOCUMENTS 6,897,099 B2   5/2005   Yoo et al.
7,642,559 B2   1/2010   Yamazaki et al.
(Continued)

FOREIGN PATENT DOCUMENTS

JP   2008-046427 A   2/2008
KR   10-2004-0009378 A   1/2004
(Continued)

OTHER PUBLICATIONS

Keunwoo Kim, Koushik K. Das, Rajiv V. Joshi, and Ching-Te Chuang, "Leakage Power Analysis of 25-nm Double-Gate CMOS Devices and Circuits", IEEE Transactions on Electron Devices, vol. 52, No. 5, May 2005, Manhattan, New York, U.S., 7 pages (980-986).

*Primary Examiner* — Tan N Tran
(74) *Attorney, Agent, or Firm* — Innovation Counsel LLP

(57) ABSTRACT

Provided are a thin-film transistor substrate that has enhanced electrical characteristics, such as off-current characteristics of a thin-film transistor, without increasing the number of mask processes, a display apparatus, and a method of manufacturing the thin-film transistor substrate. The thin-film transistor substrate includes: a semiconductor layer including a first conductive region, a second conductive region, and a first semiconductor region; a lower electrode disposed on the semiconductor layer and at least partially overlapping the first semiconductor region; and an upper electrode disposed on the lower electrode and at least partially overlapping the first semiconductor region, a first boundary between the first semiconductor region and the first conductive region coincides with an edge of the upper electrode, and a second boundary between the first semiconductor region and the second conductive region coincides with an edge of the lower electrode or an edge of the upper electrode.

11 Claims, 23 Drawing Sheets

(51) Int. Cl.
  *H01L 27/12* (2006.01)
  *H01L 29/66* (2006.01)
  *H01L 29/786* (2006.01)
  *H10K 59/12* (2023.01)

(52) U.S. Cl.
  CPC ...... *H01L 27/1255* (2013.01); *H01L 27/1274* (2013.01); *H01L 29/66757* (2013.01); *H01L 29/78675* (2013.01); *H01L 29/78696* (2013.01); *H10K 59/1201* (2023.02)

(58) Field of Classification Search
  CPC .......... H01L 27/1274; H01L 29/66757; H01L 29/78675; H01L 29/78696; H01L 27/1225; H01L 29/78645; H01L 29/42384; H01L 29/4238; H01L 27/1229; H01L 27/127; H01L 29/42376; H01L 29/7869; H01L 27/124; H01L 27/3265; H01L 27/3262; H01L 2227/323
  USPC ...................................................... 257/59, 72
  See application file for complete search history.

(56) References Cited

U.S. PATENT DOCUMENTS

| | | | |
|---|---|---|---|
| 7,952,542 | B2 | 5/2011 | Yamazaki et al. |
| 9,196,737 | B2 | 11/2015 | Zhan |
| 9,818,765 | B2 | 11/2017 | Osawa et al. |
| 9,893,135 | B2 | 2/2018 | Jin et al. |
| 10,147,352 | B2 | 12/2018 | Yoon et al. |
| 10,482,817 | B2 | 11/2019 | Kim et al. |
| 2014/0225075 | A1* | 8/2014 | Zhan ................ H01L 29/78672 257/66 |

FOREIGN PATENT DOCUMENTS

| | | |
|---|---|---|
| KR | 10-0542982 B1 | 1/2006 |
| KR | 10-0752367 B1 | 8/2007 |
| KR | 10-0766905 B1 | 10/2007 |
| KR | 10-2016-0042364 A | 4/2016 |
| KR | 10-2017-0001791 A | 1/2017 |
| KR | 10-2019-0074812 A | 6/2019 |
| KR | 10-2081283 B1 | 4/2020 |

* cited by examiner

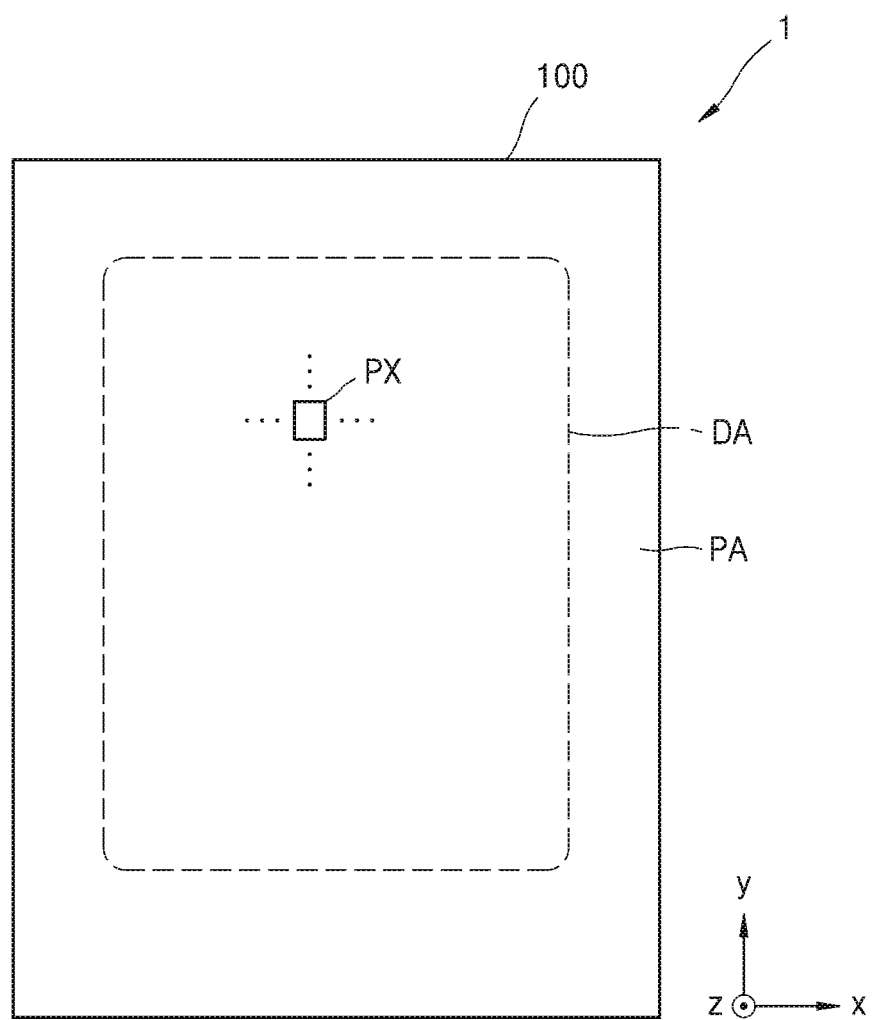

THIN FILM TRANSISTOR SUBSTRATE, DISPLAY APPARATUS, AND METHOD OF MANUFACTURING THE THIN FILM TRANSISTOR SUBSTRATE

CROSS-REFERENCE TO RELATED APPLICATION

This application is based on and claims priority under 35 U.S.C. § 119 to Korean Patent Application No. 10-2020-0162678, filed on Nov. 27, 2020, in the Korean Intellectual Property Office, the disclosure of which is incorporated by reference herein in its entirety.

BACKGROUND

1. Field

One or more embodiments relate to a thin-film transistor substrate, a display apparatus, and a method of manufacturing the thin-film transistor substrate.

2. Description of the Related Art

Display apparatuses display data visually. Display apparatuses are used as display units for small products such as mobile phones or for large products such as televisions.

These display apparatuses include a plurality of pixels that emit light by receiving an electrical signal to display an image to the outside. Each pixel includes a display element, for example, in the case of an organic light emitting display apparatus, an organic light emitting diode (OLED) is included as a display element.

In general, organic light emitting display apparatuses include thin-film transistors and a capacitor so as to control light emission of pixels. The thin-film transistor includes a semiconductor layer formed of polysilicon, for example, and a gate electrode at least partially overlapping the semiconductor layer. The semiconductor layer include a semiconductor region, also referred to as a channel region, and a conductive region doped with impurities on both sides of the semiconductor region, also referred to as an impurity region. A strong electric field may be induced between the conductive region and the gate electrode. The strong electric field may cause a short channel effect or a hot electron effect, resulting in an increase in leakage current and deterioration in off-current characteristics.

SUMMARY

One or more embodiments include a thin-film transistor substrate that has enhanced electrical characteristics, such as off-current characteristics of a thin-film transistor, without increasing the number of mask processes, a display apparatus, and a method of manufacturing the thin-film transistor substrate.

Additional aspects will be set forth in part in the description which follows and, in part, will be apparent from the description, or may be learned by practice of the presented embodiments of the disclosure.

According to one or more embodiments, a thin-film transistor substrate includes a substrate and a semiconductor layer disposed on the substrate. The semiconductor layer is disposed on the substrate and includes a first conductive region, a second conductive region, and a first semiconductor region between the first conductive region and the second conductive region. A lower electrode is disposed on the semiconductor layer and at least partially overlaps the first semiconductor region. An upper electrode is disposed on the lower electrode and at least partially overlaps the first semiconductor region. A first width of the first semiconductor region in a first direction is greater than a second width of the lower electrode in the first direction. In a plan view, a first boundary between the first semiconductor region and the first conductive region coincides with an edge of the upper electrode, and in the plan view, a second boundary between the first semiconductor region and the second conductive region coincides with an edge of the lower electrode or an edge of the upper electrode.

In the plan view, the second boundary between the first semiconductor region and the second conductive region may coincide with an edge of the lower electrode. A first separation distance between the lower electrode and the first boundary may be greater than a second separation distance between the lower electrode and the second boundary.

In the plan view, a first area in which the lower electrode and the first semiconductor region overlap each other, may be less than a second area in which the upper electrode and the first semiconductor region overlap each other.

The first semiconductor region may include a first channel region that overlaps the lower electrode, and a second channel region that does not overlap the lower electrode but overlaps the upper electrode.

The semiconductor layer may include a non-crystallization region including at least part of the second channel region and a crystallization region including the second conductive region.

The non-crystallization region may include part of the first conductive region, part of the first channel region, or part of the first conductive region and part of the first channel region.

The semiconductor layer may include a non-crystallization region corresponding to at least a portion of the second channel region and a crystallization region corresponding to the first and second conductive regions and the first channel region.

The semiconductor layer may further include a third conductive region, a fourth conductive region, and a second semiconductor region between the third conductive region and the fourth conductive region. The thin-film transistor substrate may further include a gate electrode disposed on the semiconductor layer and at least partially overlapping the second semiconductor region. In the plan view, a third boundary between the second semiconductor region and the third conductive region may coincide with an edge of the gate electrode. In the plan view, a fourth boundary between the second semiconductor region and the fourth conductive region may coincide with an edge of the gate electrode.

The semiconductor layer may include a portion that is bent at least one or more times.

A capacitor may include the lower electrode and the upper electrode.

According to one or more embodiments, a display apparatus includes a substrate, a plurality of thin-film transistors and a capacitor disposed on the substrate, and a display element. The display element is electrically connected to one among the plurality of thin-film transistors. A first thin-film transistor of the plurality of thin-film transistors includes a semiconductor layer. The semiconductor layer includes a first conductive region, a second conductive region and a first semiconductor region between the first conductive region and the second conductive region. A lower electrode is disposed on the semiconductor layer and at least partially overlaps the first semiconductor region. The capacitor includes the lower electrode and an upper electrode arranged on the lower electrode and at least partially overlapping the first semiconductor region. A first width of the first semiconductor region in a first direction is greater than a second width of the lower electrode in the first direction. In a plan view, a first boundary between the first semiconductor region and the first conductive region coincides with an edge of the upper electrode. In the plan view, a second boundary between the first semiconductor region and the second conductive region coincides with an edge of the lower electrode or an edge of the upper electrode.

The first semiconductor region may include a first channel region overlapping the lower electrode, and a second channel region that does not overlap the lower electrode but overlaps the upper electrode.

The semiconductor layer may include a non-crystallization region including at least part of the second channel region and a crystallization region including the second conductive region.

A second thin-film transistor of the plurality of thin-film transistors may include the semiconductor layer including a third conductive region, a fourth conductive region and a second semiconductor region between the third conductive region and the fourth conductive region, and a gate electrode disposed on the semiconductor layer and at least partially overlapping the second semiconductor region. In the plan view, a third boundary between the second semiconductor region and the third conductive region may coincide with an edge of the gate electrode. In the plan view, a fourth boundary between the second semiconductor region and the fourth conductive region may coincide with an edge of the gate electrode.

The first thin-film transistor may include a driving thin-film transistor configured to supply a driving current to the display element.

According to one or more embodiments, a method of manufacturing a thin-film transistor substrate includes forming a semiconductor layer on a substrate, sequentially forming a lower electrode and an upper electrode on the semiconductor layer, and injecting impurities into the semiconductor layer by using the upper electrode as a doping mask and forming the semiconductor layer. The semiconductor layer includes a first conductive region, a second conductive region, and a semiconductor region between the first conductive region and the second conductive region. A first width of the semiconductor region in a first direction is greater than a second width of the lower electrode in the first direction. A first boundary between the semiconductor region and the first conductive region is determined by an edge of the upper electrode. A second boundary between the semiconductor region and the second conductive region is determined by an edge of the lower electrode or an edge of the upper electrode.

The semiconductor region may include a first channel region overlapping the lower electrode, and a second channel region that does not overlap the lower electrode but overlaps the upper electrode.

The method may further include crystallizing at least part of the semiconductor layer.

The semiconductor layer may include a non-crystallization region including at least part of the second channel region and a crystallization region including the second conductive region.

The non-crystallization region may include part of the first conductive region, part of the first channel region, or part of the first conductive region and part of the first channel region.

Other aspects and features will be apparent from the following drawings, the claims, and a detailed description of the disclosure.

These general and specific aspects can be implemented using a system, method, computer program, or any combination of systems, methods, and computer programs.

BRIEF DESCRIPTION OF THE DRAWINGS

The above and other aspects and features of certain embodiments of the disclosure will be more apparent from the following description taken in conjunction with the accompanying drawings.

FIG. 8 is a plan view schematically illustrating a display apparatus according to embodiments.

DETAILED DESCRIPTION

Figure 1A:
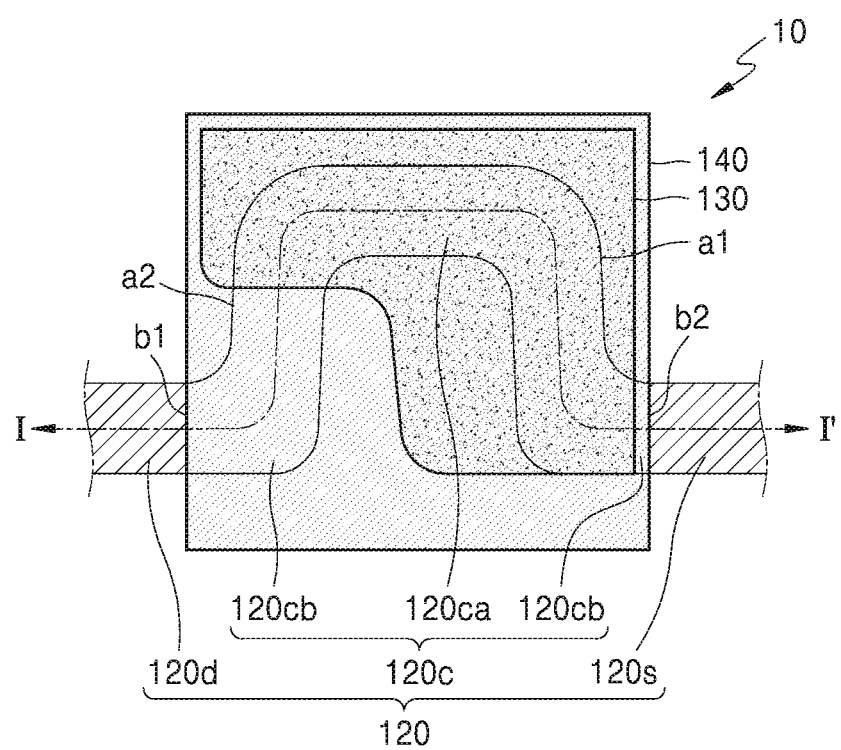
FIG. 1A is a plan view schematically illustrating a thin-film transistor substrate according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or other variations.

As the inventive concept allows for various changes and numerous embodiments, particular embodiments will be illustrated in the drawings and described in detail in the written description. The effects and features of the present disclosure, and a way to achieve them will be apparent by referring to embodiments that will be described in detail together with the drawings.

Hereinafter, embodiments of the present disclosure will be described below in more detail with reference to the accompanying drawings. Those elements that are the same or are in correspondence are rendered the same reference numeral regardless of the figure number, and a redundant description of the elements is omitted.

It will be understood that although the terms "first," "second," etc. may be used herein to describe various elements, these elements should not be limited by these terms. These elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on" another layer, region, or element, it may be directly or indirectly formed on the other layer, region, or element. That is, for example, intervening layers, regions, or elements may be present.

Sizes of elements in the drawings may be exaggerated or reduced for convenience of explanation. In other words, the sizes and thicknesses of components in the drawings are arbitrarily illustrated for convenience of explanation.

When a certain embodiment may be implemented differently, a specific process order may be performed differently from the described order. For example, two consecutively described processes may be performed substantially at the same time or performed in an order opposite to the described order.

In the present specification, "A and/or B" represents A, B, or A and B. "At least one of A and B" represents A, B, or A and B.

It will be understood that when a layer, region, or element is referred to as being "connected to," another layer, region, or element, it may be directly or indirectly connected to the other layer, region, or element. That is, for example, intervening layers, regions, or elements may be present. For example, it will be understood that when a layer, region, or element is referred to as being "electrically connected to," another layer, region, or element, it may be directly or indirectly connected to the other layer, region, or element. That is, for example, intervening layers, regions, or elements may be present.

The x-axis, the y-axis and the z-axis can be other than the three axes of the rectangular coordinate system, and may be interpreted in a broad sense. For example, the x-axis, the y-axis, and the z-axis may be perpendicular to one another, or may represent different directions that are not perpendicular to one another.

Figure 1B:
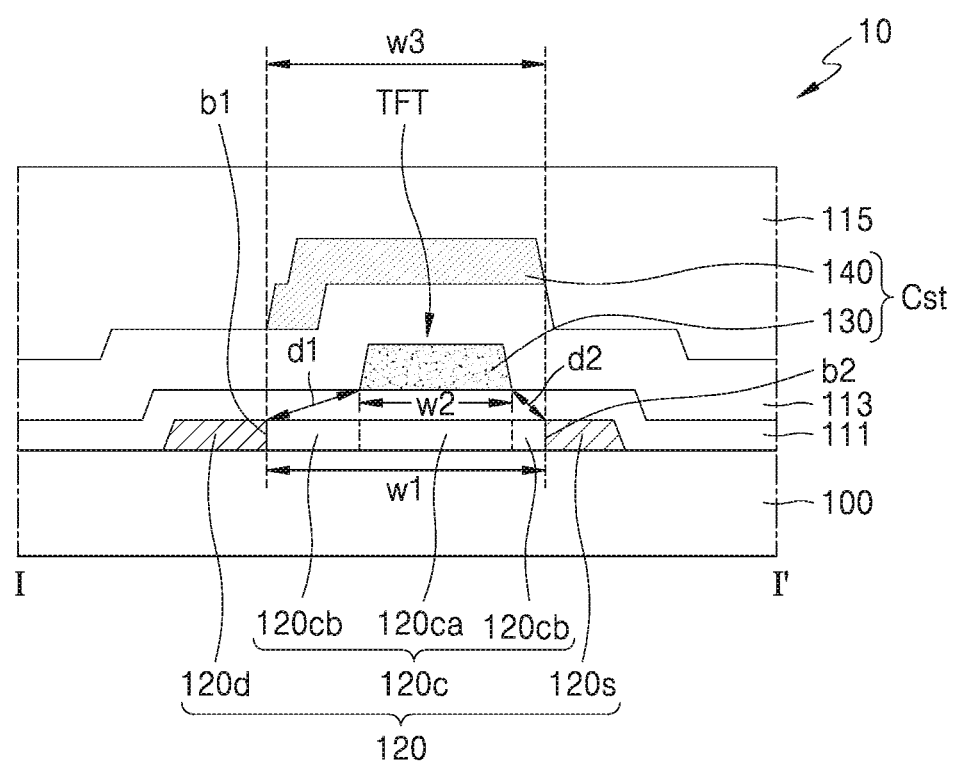
FIG. 1B is a cross-sectional view of the thin-film transistor substrate of FIG. 1A taken along line I-I', according to embodiments.

FIG. 1A is a plan view schematically illustrating a thin-film transistor substrate 10 according to embodiments. FIG. 1B is a cross-sectional view of the thin-film transistor substrate 10 of FIG. 1A taken along line I-I', according to embodiments.

Referring to FIGS. 1A and 1B, the thin-film transistor substrate 10 may include a substrate 100 and a thin-film transistor TFT on the substrate 100. The thin-film transistor substrate 10 may further include a capacitor Cst on the thin-film transistor TFT. The thin-film transistor substrate 10 refers to all devices including the thin-film transistor TFT. For example, the thin-film transistor substrate 10 may be an organic light emitting display apparatus, or a flat panel display apparatus such as a liquid display apparatus.

Hereinafter, a configuration included in the thin-film transistor substrate 10 will be described with reference to FIG. 1B in more detail according to a stacking sequence.

The substrate 100 may include a glass material, a ceramic material, a metal material, or a flexible or bendable material. When the substrate 100 is flexible or bendable, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate.

The substrate 100 may have a single layer or multi-layer structure of the above-described material. When the substrate 100 has a multi-layer structure, the substrate 100 may further include an inorganic layer. In some embodiments, the substrate 100 may have a structure of an organic material/inorganic material/organic material.

A buffer layer (not shown) may be arranged on the substrate 100. The buffer layer may prevent diffusion of impurity ions and penetration of moisture or outdoor air and may provide a planarized surface. A barrier layer (not shown) may be further included between the substrate 100 and the buffer layer. The barrier layer may prevent impurities from penetrating into a semiconductor layer 120 from the substrate 100 or may minimize penetration. The barrier layer may include an inorganic material such as oxide or nitride, an organic material, or an organic/inorganic composite material and may have a single layer or multi-layer structure of the inorganic material and the organic material.

The thin-film transistor TFT may be arranged on the substrate 100. The thin-film transistor TFT may include the semiconductor layer 120 on which a channel is formed, a lower electrode 130 configured to apply an electric field so that the channel may be formed, and a first gate insulating layer 111 between the semiconductor layer 120 and the lower electrode 130.

The semiconductor layer 120 may include amorphous silicon or polysilicon. In an embodiment, the semiconductor layer 120 may include oxide including at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer 120 may be an InSnZnO (ITZO) semiconductor layer, an InGaZnO (IGZO) semiconductor layer, or the like.

In some embodiments, the semiconductor layer 120 may include a portion that is bent at least one or more times. For example, as shown in FIG. 1A, the semiconductor layer 120 may have a shape of omega (Ω). In another example, the semiconductor layer 120 may have a shape such as an alphabet "S" that is bent a plurality of times, and the shape of the semiconductor layer 120 may vary according to design.

The semiconductor layer 120 may include a first semiconductor region 120c in which a channel is formed, and a first conductive region 120d and a second conductive region 120s, which are arranged at both sides of the first semiconductor region 120c. When the semiconductor layer 120 includes a portion that is bent at least one or more times, the length of the first semiconductor region 120c may increase as compared to a straight portion. For example, as shown in FIG. 1A, when the semiconductor layer 120 has the shape of omega (Ω), the length of the first semiconductor region 120c may increase.

In an example, the length of the first semiconductor region 120c may be about 10 μm to about 40 μm. When a display element is driven using a thin-film transistor including a semiconductor region having a length less than 10 μm, the thin-film transistor may operate sensitively due to a short semiconductor region. Thus, when the display element is driven using a sensitive thin-film transistor, the luminance of the display element may be decreased, or dark spot defects may occur. Also, the thin-film transistor including the semiconductor region having a length more than 40 μm may have a low operating speed. Thus, when the thin-film transistor is used as a display panel, charging defects of the display panel may occur due to a very long semiconductor region.

In an embodiment, when the semiconductor layer 120 is a p-type semiconductor, the first conductive region 120d may be a drain region, and the second conductive region 120s may be a source region.

The first gate insulating layer 111 arranged on the semiconductor layer 120 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The lower electrode 130 may be arranged on the first gate insulating layer 111. At least part of the lower electrode 130 may overlap the semiconductor layer 120. The lower electrode 130 may function as a gate electrode of the thin-film transistor TFT. The lower electrode 130 may have a single layer or multi-layer structure including at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In an embodiment, the lower electrode 130 may be formed not to overlap part of the first semiconductor region 120c. Part of the first semiconductor region 120c that does not overlap the lower electrode 130 may be a second channel region 120cb to be described below. For example, as shown in FIG. 1A, the lower electrode 130 may have a planar shape of a rounded rectangle, and at least one of corners of the lower electrode 130 may be chamfered. The lower electrode 130 may have a planar shape of a concave polygon. For example, the planar shape of the lower electrode 130 may be in agreement and consonant with the shape '¬.' In FIG. 1A, the lower electrode 130 is illustrated to have a curved line, but the lower electrode 130 may not have a curved line.

In an embodiment, as shown in FIG. 1B, a first width w1 of the first semiconductor region 120c that follows a first direction, for example, a direction perpendicular to the thickness direction of the substrate 100 and/or a channel length direction, may be greater than a second width w2 of the lower electrode 130 that follows the first direction.

A second gate insulating layer 113 may be arranged on the lower electrode 130. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode 140 may be arranged on the second gate insulating layer 113. At least part of the upper electrode 140 may overlap the first semiconductor region 120c. The upper electrode 140 may have a single layer or multi-layer structure including at least one metal selected from the group consisting of Al, Pt, Pd, Ag, Mg, Au, Ni, Nd, Ir, Cr, Li, Ca, Mo, Ti, W, and Cu.

The upper electrode 140 may overlap the lower electrode 130 with the second gate insulating layer 113 between the upper electrode 140 and the lower electrode 130. In this case, the upper electrode 140 and the lower electrode 130 may constitute the capacitor Cst. In this case, the second gate insulating layer 113 may function as a dielectric layer of the capacitor Cst, and the lower electrode 130 and the upper electrode 140 may function as a first electrode and a second electrode of the capacitor Cst, respectively. As described above, the lower electrode 130 may function as a first electrode of the capacitor Cst and as a gate electrode of the thin-film transistor TFT.

A third width w3 of the upper electrode 140 in the channel length direction may be the same as the first width w1 that is the channel length of the first semiconductor region 120c. Both edges of the upper electrode 140 in the channel length direction may define the channel length of the first semiconductor region 120c. That is, as shown in FIGS. 1A and 1B, in a plan view, a first boundary b1 between the first conductive region 120d and the first semiconductor region 120c may coincide with an edge of the upper electrode 140. The first boundary b1 between the first conductive region 120d and the first semiconductor region 120c may be determined by the edge of the upper electrode 140. Also, in a plan view, a second boundary b2 between the second conductive region 120s and the first semiconductor region 120c may coincide with the edge of the upper electrode 140. The second boundary b2 between the second conductive region 120s and the first semiconductor region 120c may be determined by the edge of the upper electrode 140.

In an embodiment, the first semiconductor region 120c may include a first channel region 120ca and the second channel region 120cb. The first channel region 120ca may overlap the lower electrode 130. The first channel region 120ca may overlap the upper electrode 140. The second channel region 120cb may not overlap the lower electrode 130 but may overlap the upper electrode 140.

As shown in FIG. 1A, in a plan view, a first area a1 in which the lower electrode 130 and the first semiconductor region 120c overlap each other, may be less than a second area a2 in which the upper electrode 140 and the first semiconductor region 120c overlap each other. The first area a1 in which the lower electrode 130 and the first semiconductor region 120c overlap each other is the same as the area of the first channel region 120ca. The second area a2, in which the upper electrode 140 and the first semiconductor region 120c overlap each other, is the same as the sum of the area of the first channel region 120ca and the area of the second channel region 120cb. Thus, the first area a1 in which the lower electrode 130 and the first semiconductor region 120c overlap each other, may be less than the second area a2 in which the upper electrode 140 and the first semiconductor region 120c overlap each other.

In an embodiment, as shown in FIG. 1B, a first separation distance d1 between the lower electrode 130 and the first boundary b1 between the first semiconductor region 120c and the first conductive region 120d may be greater than a second separation distance d2 between the lower electrode 130 and the second boundary b2 between the first semiconductor region 120c and the second conductive region 120s. Here, the first separation distance d1 may be a distance between an edge of the lower electrode 130 that is closest to the first boundary b1, and the first boundary b1. The second separation distance d2 may be a distance between an edge of the lower electrode 130 that is closest to the second boundary b2, and the second boundary b2. Alternatively, the first separation distance d1 may be a distance between the center of the lower electrode 130 and the first boundary b1. The second separation distance d2 may be a distance between the center of the lower electrode 130 and the second boundary b2. The center of the lower electrode 130 may be the center in a first direction, e.g., a direction perpendicular to the thickness direction of the substrate 100 or a channel length direction.

According to an embodiment, the lower electrode 130 may be disposed closer to the second conductive region 120s than the first conductive region 120d. The first separation distance d1 between the first conductive region 120d and the lower electrode 130 may be greater than the second separation distance d2 between the second conductive region 120s and the lower electrode 130. As a result, it will be understood that the first gate insulating layer 111 having the same thickness (thickness as measured in the direction of the first separation distance d1) as the first separation distance d1 is between the first conductive region 120d and the lower electrode 130. Similarly, it will be understood that the first gate insulating layer 111 having the same thickness (thickness as measured in the direction of the second separation distance d2) as the second separation distance d2 is between the second conductive region 120s and the lower electrode 130. The thickness of the first gate insulating layer 111 between the first conductive region 120d and the lower electrode 130 may be relatively greater than the thickness of the first gate insulating layer 111 between the second conductive region 120s and the lower electrode 130.

Thus, the strength of an electric field formed between the first conductive region 120d and the lower electrode 130 may be weakened. When the semiconductor layer 120 is a p-type semiconductor, as described above, the first conductive region 120d may be a drain region, and the second conductive region 120s may be a source region. The strength of the electric field formed between the drain region and the lower electrode 130 may be weakened, and gate induced drain leakage (GIDL) may be decreased. A drain leakage current caused by the lower electrode 130 may be decreased.

An interlayer insulating layer 115 may be arranged on the second gate insulating layer 113 and the upper electrode 140. The interlayer insulating layer 115 may include an inorganic material including oxide or nitride. For example, the interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). Alternatively, the interlayer insulating layer 115 may include an organic material such as acryl, benzocyclobutene (BCB), polyimide, or hexamethyldisiloxane (HMDSO).

Although not shown in FIG. 1B, electrode patterns that function as a wiring may be arranged on the interlayer insulating layer 115. The electrode patterns may be electrically connected to the thin-film transistor TFT and the capacitor Cst by using contact holes that pass through the interlayer insulating layer 115. The electrode patterns may be a drain electrode connected to the first conductive region 120d, a source electrode connected to the second conductive region 120s, a gate wiring connected to the lower electrode 130, and a wiring connected to the upper electrode 140.

Although not shown in FIG. 1B, the thin-film transistor substrate 10 may further include a thin-film transistor in which both the first gate insulating layer 111 and the second gate insulating layer 113 are used as gate insulating layers. The thin-film transistor may include a semiconductor layer arranged on the same plane as the semiconductor layer 120 and a gate electrode arranged on the same plane as the upper electrode 140. In this case, only the first gate insulating layer 111 and the second gate insulating layer 113 may be arranged between the semiconductor layer and the gate electrode. The thin-film transistor has a wide operating range, because a channel may be formed only by applying a higher voltage to the gate electrode compared to the thin-film transistor TFT using only the first gate insulating layer 111 as a gate insulating layer.

FIGS. 2A through 2D are cross-sectional views according to a process sequence for describing a method of manufacturing the thin-film transistor substrate shown in FIG. 1B, according to embodiments.

Figure 2A:
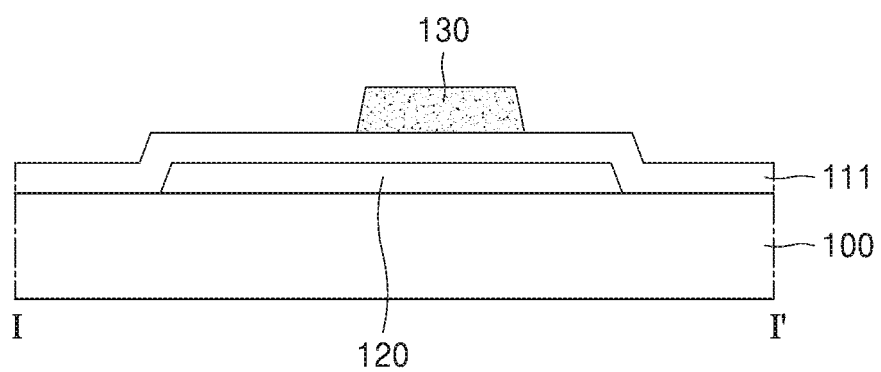
FIGS. 2A, 2B, 2C, and 2D are cross-sectional views according to a process sequence for describing a method of manufacturing the thin-film transistor substrate shown in FIG. 1B, according to embodiments.

Referring to FIG. 2A, the substrate 100, the semiconductor layer 120 on the substrate 100, the first gate insulating layer 111 for covering the semiconductor layer 120, and the lower electrode 130 are shown.

The substrate 100 may be formed of a transparent glass material containing $SiO_2$ as a main component. In an embodiment, the substrate 100 may also be formed of a transparent plastic material. In this case, the plastic material forming the substrate 100 may be at least one selected from various organic materials.

Although not shown in FIG. 2A, a buffer layer may be formed on the substrate 100. The buffer layer may include an inorganic insulating layer such as silicon oxide, silicon nitride, silicon oxynitride, aluminum oxide, aluminum nitride, titanium oxide, or titanium nitride. The buffer layer may include an organic insulating material such as polyimide, polyester, or acrylic, or may be formed of a stack of the illustrated materials or a stack of an organic insulating material and an inorganic insulating material. The buffer layer is not an essential component and thus may be omitted according to process conditions.

The semiconductor layer 120 may be formed on the substrate 100. In detail, a polysilicon layer (not shown) may be formed by depositing a semiconductor material layer (not shown), for example, an amorphous silicon layer, on the substrate 100 and then crystalizing the semiconductor material layer. The amorphous silicon may be crystallized by using various methods, such as rapid thermal annealing (RTA), solid phase crystallization (SPC), excimer laser annealing (ELA), metal induced crystallization (MIC), metal induced lateral crystallization (MILC), and sequential lateral solidification (SLS). The polysilicon layer formed in this way may be patterned into the semiconductor layer 120 by using a photolithography process using a first mask (not shown).

Also, in another example, the amorphous silicon layer is first patterned and crystallized, so that the semiconductor layer 120 formed of polysilicon may also be formed.

The semiconductor layer 120 may be formed of an element semiconductor based on silicon. In other examples, the semiconductor layer 120 may be formed of a compound semiconductor, for example, an oxide semiconductor or organic semiconductor.

The first gate insulating layer 111 for covering the semiconductor layer 120 may be formed on the substrate 100. The first gate insulating layer 111 may include oxide, nitride, oxynitride, or a combination of oxide, nitride, oxynitride.

The lower electrode 130 at least partially overlapping the semiconductor layer 120 may be formed on the first gate insulating layer 111. Specifically, a first conductive layer (not shown) may be stacked on the first gate insulating layer 111, and the first conductive layer may be patterned into the lower electrode 130 by using a photolithography process and an etching process using a second mask (not shown).

Figure 2B:
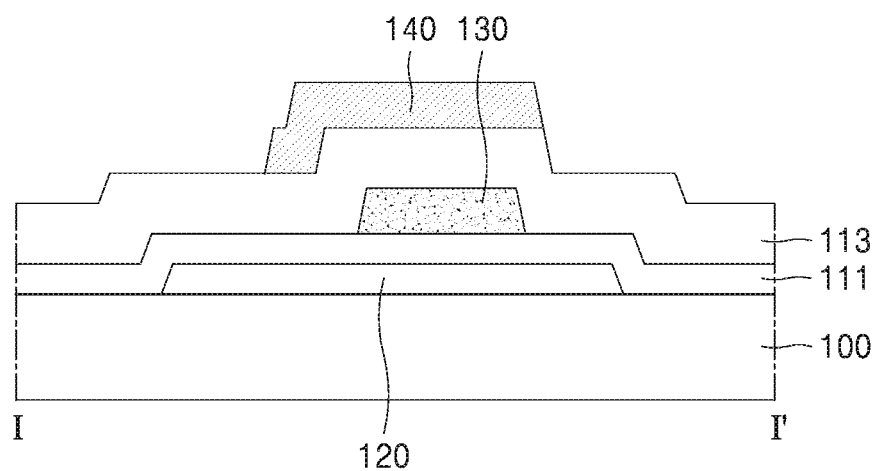

Referring to FIG. 2B, the second gate insulating layer 113 and the upper electrode 140, which cover the lower electrode 130, are shown.

The second gate insulating layer 113 for covering the lower electrode 130 may be formed on the first gate insulating layer 111. The second gate insulating layer 113 may be formed of oxide, nitride, oxynitride, or a combination of oxide, nitride, oxynitride. The second gate insulating layer 113 may be formed of the same material as the first gate insulating layer 111. In another example, the second gate insulating layer 113 may be formed of a different material.

The upper electrode 140 overlapping the semiconductor layer 120 may be formed on the second gate insulating layer 113. Specifically, a second conductive layer (not shown) may be stacked on the second gate insulating layer 113, and the second conductive layer may be patterned into the upper electrode 140 by using a photolithography process and an etching process using a third mask (not shown).

Figure 2C:
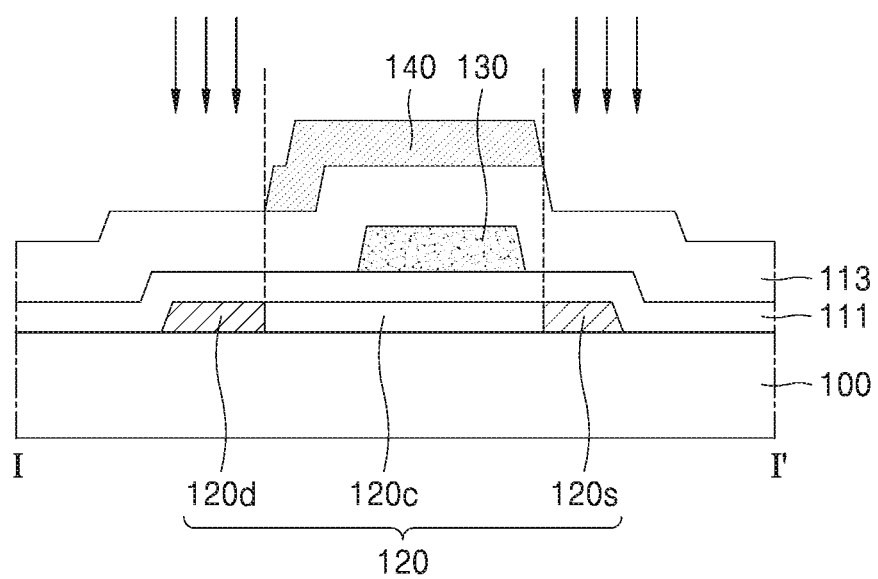

Referring to FIG. 2C, an ion implantation process in which the upper electrode 140 is used as a doping mask, may be performed. Impurity ions may be injected into a portion of the semiconductor layer 120 that is not covered by the upper electrode 140. As a result, the first semiconductor region 120c may be formed in a portion of the semiconductor layer 120 that is covered by the upper electrode 140, and the first conductive region 120d and the second conductive region 120s may be formed in a portion of the semiconductor layer 120 that is not covered by the upper electrode 140. The semiconductor layer 120 may be classified into the first semiconductor region 120c, the first conductive region 120d, and the second conductive region 120s.

Figure 3A:
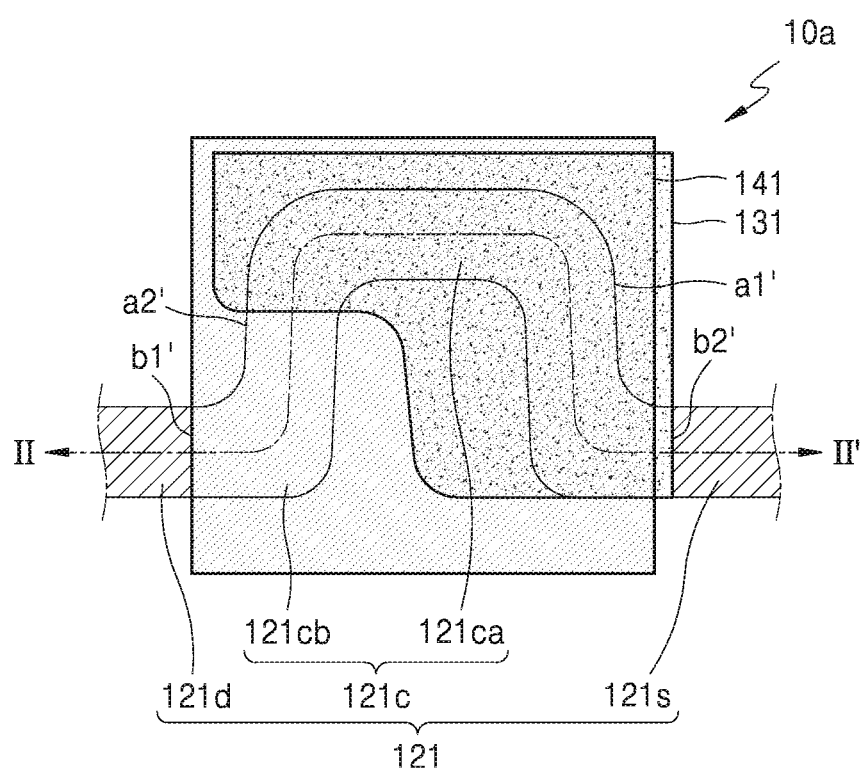
FIG. 3A is a plan view schematically illustrating a thin-film transistor substrate according to embodiments.
Figure 3B:
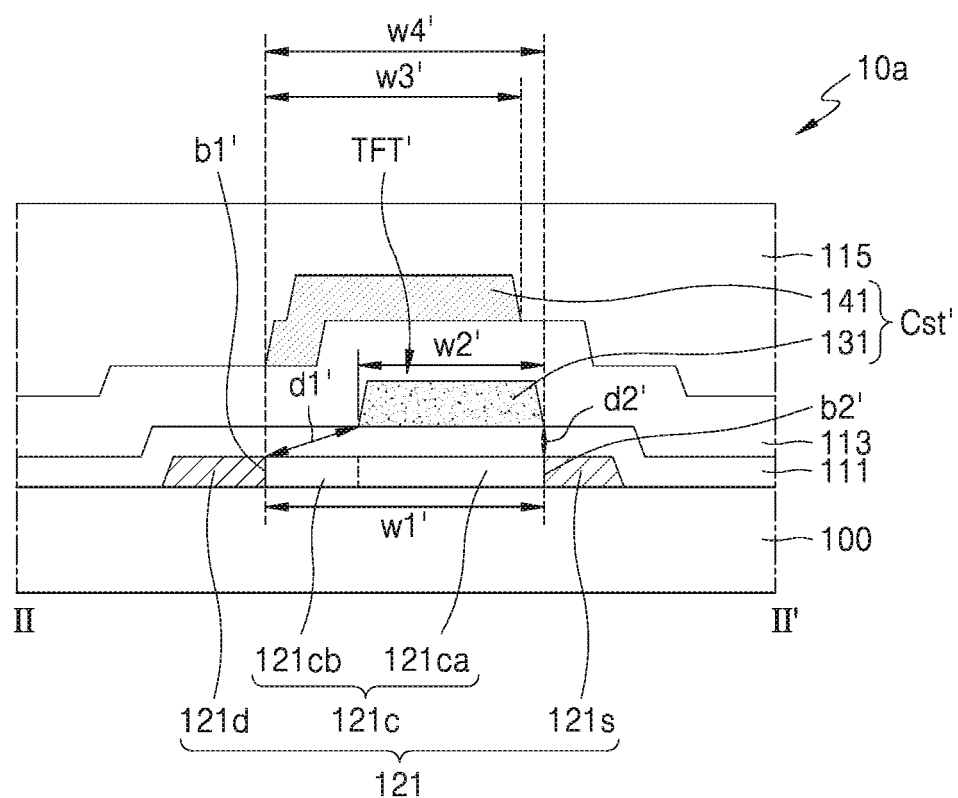
FIG. 3B is a cross-sectional view of the thin-film transistor substrate of FIG. 3A taken along line II-II', according to embodiments.

In FIG. 2C, since the lower electrode 130 overlaps the upper electrode 140 in the channel length direction of the semiconductor layer 120, only the upper electrode 140 is used as a doping mask. In another example, as shown in FIGS. 3A and 3B to be described below, part of the lower electrode 130 may overlap the upper electrode 140, and the lower electrode 130 and the upper electrode 140 may be used as a doping mask.

Figure 2D:
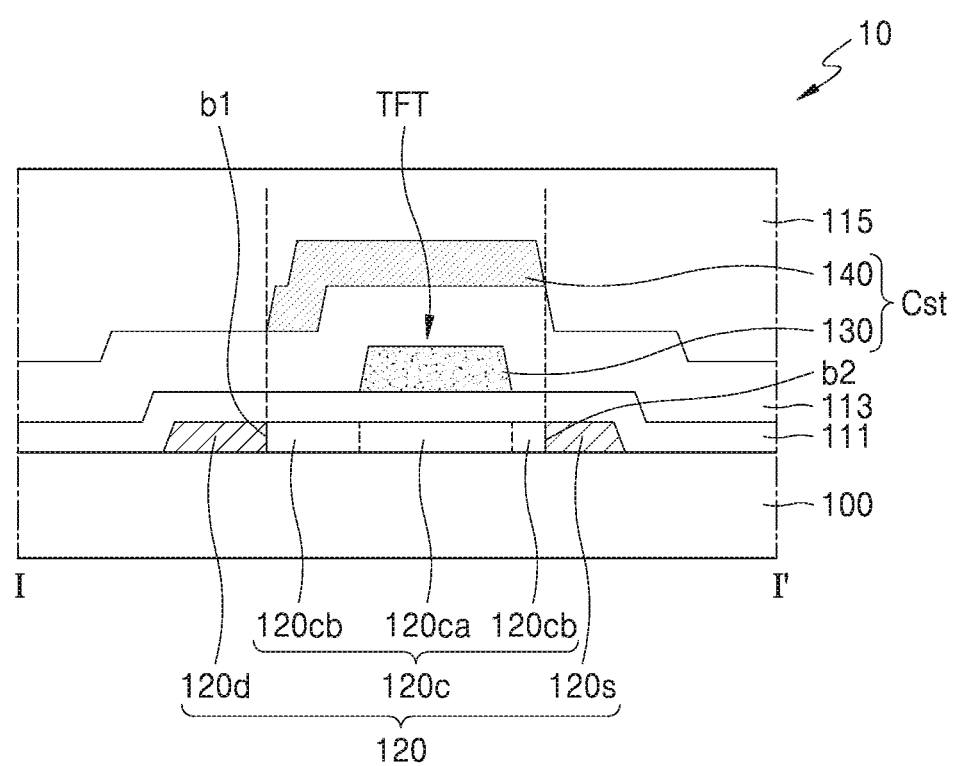

Referring to FIG. 2D, an interlayer insulating layer 115 for covering the upper electrode 140 may be formed on the second gate insulating layer 113.

Since the first semiconductor region 120c, the first conductive region 120d and the second conductive region 120s are formed by using the upper electrode 140 as a doping mask, the first boundary b1 between the first conductive region 120d and the first semiconductor region 120c may be determined by an edge of the upper electrode 140. Also, the second boundary b2 between the second conductive region 120s and the first semiconductor region 120c may be determined by an edge of the upper electrode 140.

In an embodiment, the first semiconductor region 120c may include a first channel region 120ca and a second channel region 120cb. The first channel region 120ca may overlap the lower electrode 130. The first channel region 120ca may overlap the upper electrode 140. The second channel region 120cb may not overlap the lower electrode 130 but overlap the upper electrode 140.

FIG. 3A is a plan view schematically illustrating a thin-film transistor substrate according to embodiments. FIG. 3B is a cross-sectional view of the thin-film transistor of FIG. 3A taken along line II-II', according to embodiments. The same reference numerals of FIGS. 3A and 3B as those of FIGS. 1A and 1B represent the same elements and thus, a redundant description of the same elements will be omitted.

Referring to FIGS. 3A and 3B, a thin-film transistor substrate 10a may include a substrate 100 and a thin-film transistor TFT' on the substrate 100. The thin-film transistor substrate 10a may further include a capacitor Cst' on the thin-film transistor TFT'.

The thin-film transistor TFT' may be arranged on the substrate 100. The thin-film transistor TFT' may include a semiconductor layer 121 in which a channel is formed, a lower electrode 131 configured to apply an electric field so that a channel may be formed, and a first gate insulating layer 111 between the semiconductor layer 121 and the lower electrode 131.

The semiconductor layer 121 may include amorphous silicon or polysilicon. In an embodiment, the semiconductor layer 121 may include oxide including at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

In an embodiment, the semiconductor layer 121 may include a portion that is bent at least one or more times. For example, as shown in FIG. 3A, the semiconductor layer 121 may have a shape of omega ($\Omega$). In another example, the semiconductor layer 121 may have a shape such as an alphabet "S" that is bent a plurality of times, and the shape of the semiconductor layer 121 may vary according to design.

The semiconductor layer 121 may include a first semiconductor region 121c in which a channel is formed, and a first conductive region 121d and a second conductive region 121s at both sides of the first semiconductor region 121c. When the semiconductor layer 121 includes a portion that is bent at least one or more times, the length of the first semiconductor region 121c may increase as compared to a straight portion. For example, as shown in FIG. 3A, when the semiconductor layer 121 has a shape of omega ($\Omega$), the length of the first semiconductor region 121c may increase.

In an embodiment, when the semiconductor layer 121 is a p-type semiconductor layer, the first conductive region 121d may be a drain region, and the second conductive region 121s may be a source region.

The lower electrode 131 may be arranged on the first gate insulating layer 111. At least part of the lower electrode 131 may overlap the semiconductor layer 121. The lower electrode 131 may function as a gate electrode of the thin-film transistor TFT'. The lower electrode 131 may have a single layer or multi-layer structure including at least one metal selected from the group consisting of Al, Pt, Pd, Ag, Mg, Au, Ni, Nd, Ir, Cr, Li, Ca, Mo, Ti, W, and Cu.

In an embodiment, the lower electrode 131 may be formed not to overlap part of the first semiconductor region 121c. Part of the first semiconductor region 121c that does not overlap the lower electrode 131 may be a second channel region 121cb to be described below. For example, as shown in FIG. 3A, the lower electrode 131 may have a planar shape of a rounded rectangle, and at least one of corners of the lower electrode 131 may be chamfered. The lower electrode 131 may have a planar shape of a concave polygon. For example, the planar shape of the lower electrode 131 may be in agreement and consonant with the shape '¬.' In FIG. 3A, the lower electrode 131 is illustrated to have a curved line, but the lower electrode 131 may not have a curved line.

In an embodiment, as shown in FIG. 3B, a first width w1' of the first semiconductor region 120c that follows a first direction, for example, a direction perpendicular to the thickness direction of the substrate 100 and or a channel length direction, may be greater than a second width w2' of the lower electrode 131 that follows the first direction.

An upper electrode 141 may be arranged on the second gate insulating layer 113. At least part of the upper electrode 141 may overlap the first semiconductor region 121c. The upper electrode 141 may have a single layer or multi-layer structure including at least one metal selected from the group consisting of Al, Pt, Pd, Ag, Mg, Au, Ni, Nd, Ir, Cr, Li, Ca, Mo, Ti, W, and Cu.

The upper electrode 141 may overlap the lower electrode 131 with the second gate insulating layer 113 between the upper electrode 141 and the lower electrode 131. In this case, the upper electrode 141 and the lower electrode 131 may constitute the capacitor Cst'. In this case, the second gate insulating layer 113 may function as a dielectric layer of the capacitor Cst', and the lower electrode 131 and the upper electrode 141 may function as a first electrode and a second electrode of the capacitor Cst', respectively. As described above, the lower electrode 131 may function as the first electrode of the capacitor Cst' and as a gate electrode of the thin-film transistor TFT'.

In an embodiment, a third width w3' of the upper electrode 141 in the channel length direction may be less than the first width w1' that is a channel length of the first semiconductor region 121c.

As described above, the second width w2' of the lower electrode 131 in the channel length direction may be less than the first width w1' that is a channel length of the first semiconductor region 121c. The upper electrode 141 and the lower electrode 131 may overlap each other in the channel length direction, and a total width w4' of the upper electrode 141 and the lower electrode 131 in the channel length direction may be the same as the first width w1' that is a channel length of the first semiconductor region 121c.

One edge of the upper electrode 141 in the channel length direction and one edge of the lower electrode 131 in the channel length direction may define a channel length of the first semiconductor region 121c. That is, the lower electrode 131 and the upper electrode 141 may be used as a doping mask during an ion implantation process of FIG. 2C.

As shown in FIGS. 3A and 3B, in a plan view, a first boundary b1' between the first conductive region 121d and the first semiconductor region 121c may coincide with an edge of the upper electrode 141. The first boundary b1' between the first conductive region 121d and the first semiconductor region 121c may be determined by the edge of the upper electrode 141. Also, in a plan view, a second boundary b2' between the second conductive region 121s and the first semiconductor region 121c may coincide with an edge of the lower electrode 131. The second boundary b2' between the second conductive region 121s and the first semiconductor region 121c may be determined by the edge of the lower electrode 131.

In an embodiment, the first semiconductor region 121c may include a first channel region 121ca and a second channel region 121cb. The first channel region 121ca may overlap the lower electrode 131. The first channel region 121ca may partially overlap the upper electrode 141. The second channel region 121cb may not overlap the lower electrode 131 but may overlap the upper electrode 141.

As shown in FIG. 3A, in a plan view, a first area a1' in which the lower electrode 131 and the first semiconductor region 121c overlap each other, may be less than a second area a2' in which the upper electrode 141 and the first semiconductor region 121c overlap each other. In another example, the first area a1' in which the lower electrode 131 and the first semiconductor region 121c overlap each other, may be the same as the second area a2' in which the upper electrode 141 and the first semiconductor region 121c overlap each other. In another example, the first area a1' in which the lower electrode 131 and the first semiconductor region 121c overlap each other, may be greater than the second area a2' in which the upper electrode 141 and the first semiconductor region 121c overlap each other. For example, the lower electrode 131 may extend toward the second conductive region 121s, and as the lower electrode 131 extends, the first area a1' may increase and be equal to or greater than the area a2'.

In an embodiment, as shown in FIG. 3B, a first separation distance d1' between the lower electrode 131 and the first boundary b1' between the first semiconductor region 121c and the first conductive region 121d may be greater than a second separation distance d2' between the lower electrode 131 and the second boundary b2' between the first semiconductor region 121c and the second conductive region 121s. Here, the first separation distance d1' may be a distance between an edge of the lower electrode 131 that is closest to the first boundary b1', and the first boundary b1'. The second separation distance d2' may be a distance between an edge of the lower electrode 131 that is closest to the second boundary b2', and the second boundary b2'. Alternatively, the first separation distance d1' may be a distance between the center of the lower electrode 131 and the first boundary b1'. The second separation distance d2' may be a distance between the center of the lower electrode 131 and the second boundary b2'. The center of the lower electrode 131 may be a center in the first direction, for example, a direction perpendicular to the thickness direction of the substrate 100 or a channel length direction.

According to an embodiment, the lower electrode 131 may be disposed closer to the second conductive region 121s than the first conductive region 121d. The first separation distance d1' between the first conductive region 121d and the lower electrode 131 may be greater than a second separation distance d2' between the second conductive region 121s and the lower electrode 131. Thus, the strength of an electric field formed between the first conductive region 121d and the lower electrode 131 may be weakened.

When the semiconductor layer 121 is a p-type semiconductor, the first conductive region 121d may be a drain region, and the second conductive region 121s may be a source region. The strength of an electric field formed between the drain region and the lower electrode 131 may be weakened, and gate induced drain leakage may be reduced. A drain leakage current caused by the lower electrode 131 may be reduced.

Figure 4:
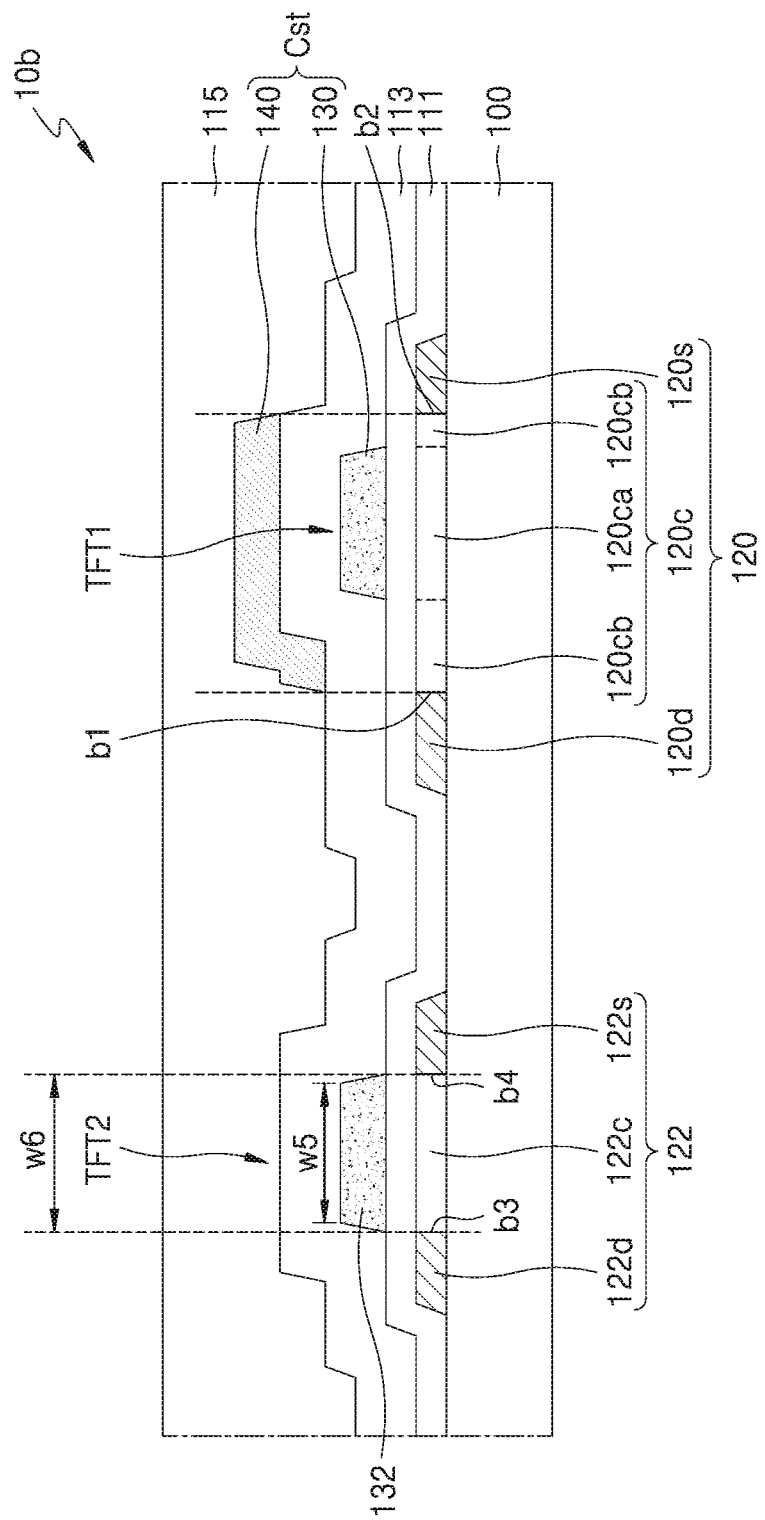
FIG. 4 is a cross-sectional view schematically illustrating a thin-film transistor substrate according to embodiments.

FIG. 4 is a cross-sectional view schematically illustrating a thin-film transistor substrate 10b according to embodiments. The same reference numerals of FIG. 4 as those of FIGS. 1A and 1B represent the same elements and thus, a redundant description of the same elements will be omitted.

Referring to FIG. 4, the thin-film transistor substrate 10b may include a first thin-film transistor TFT1 and a second thin-film transistor TFT2. Here, the first thin-film transistor TFT1 may be the thin-film transistor TFT of FIG. 1B, the thin-film transistor TFT' of FIG. 3B, or the thin-film transistor TFT" of FIG. 5 to be described below. In FIG. 4, the first thin-film transistor TFT1 is the thin-film transistor TFT of FIG. 1B. The first thin-film transistor TFT1 will be replaced with the description of FIG. 1B, FIG. 3B, or FIG. 5, and the second thin-film transistor TFT2 will be described below.

The second thin-film transistor TFT2 may be arranged on the substrate 100. The second thin-film transistor TFT2 may include a semiconductor layer 122 on which a channel is formed, a gate electrode 132 configured to apply an electric field so that the channel may be formed, and a first gate insulating layer 111 between the semiconductor layer 122 and the gate electrode 132.

The semiconductor layer 122 may include amorphous silicon or polysilicon. In an embodiment, the semiconductor layer 122 may include oxide including at least one material selected from the group consisting of In, Ga, Sn, Zr, V, Hf, Cd, Ge, Cr, Ti, Al, Cs, Ce, and Zn. For example, the semiconductor layer 122 may be an InSnZnO (ITZO) semiconductor layer, an InGaZnO (IGZO) semiconductor, or the like.

In FIG. 4, the semiconductor layer 120 of the first thin-film transistor TFT1 and the semiconductor layer 122 of the second thin-film transistor TFT2 are formed as separated patterns. However, the semiconductor layer 120 of the first thin-film transistor TFT1 and the semiconductor layer 122 of the second thin-film transistor TFT2 may be formed as one pattern. The semiconductor layer 120 of the first thin-film transistor TFT1 and the semiconductor layer 122 of the second thin-film transistor TFT2 may have various shapes according to design.

The semiconductor layer 122 may include a second semiconductor region 122c in which a channel is formed, and a third conductive region 122d and a fourth conductive region 122s, which are arranged at both sides of the second semiconductor region 122c.

The gate electrode 132 may be arranged on the first gate insulating layer 111. At least part of the gate electrode 132 may overlap the semiconductor layer 122. The gate electrode 132 may have a single layer or multi-layer structure including at least one metal selected from the group consisting of Al, Pt, Pd, Ag, Mg, Au, Ni, Nd, Ir, Cr, Li, Ca, Mo, Ti, W, and Cu.

A fifth width w5 of the gate electrode 132 in a channel length direction may be the same as a sixth width w6 that is a channel length of the second semiconductor region 122c. Both edges of the gate electrode 132 in the channel length direction may define the channel length of the second semiconductor region 122c. That is, a third boundary b3 between the third conductive region 122d and the second semiconductor region 122c may coincide with an edge of the gate electrode 132. The third boundary b3 between the third conductive region 122d and the second semiconductor region 122c may be defined by the edge of the gate electrode 132. Also, a fourth boundary b4 between the fourth conductive region 122s and the second semiconductor region 122c may coincide with the edge of the gate electrode 132. The fourth boundary b4 between the fourth conductive region 122s and the second semiconductor region 122c may be determined by the edge of the gate electrode 132.

Figure 5:
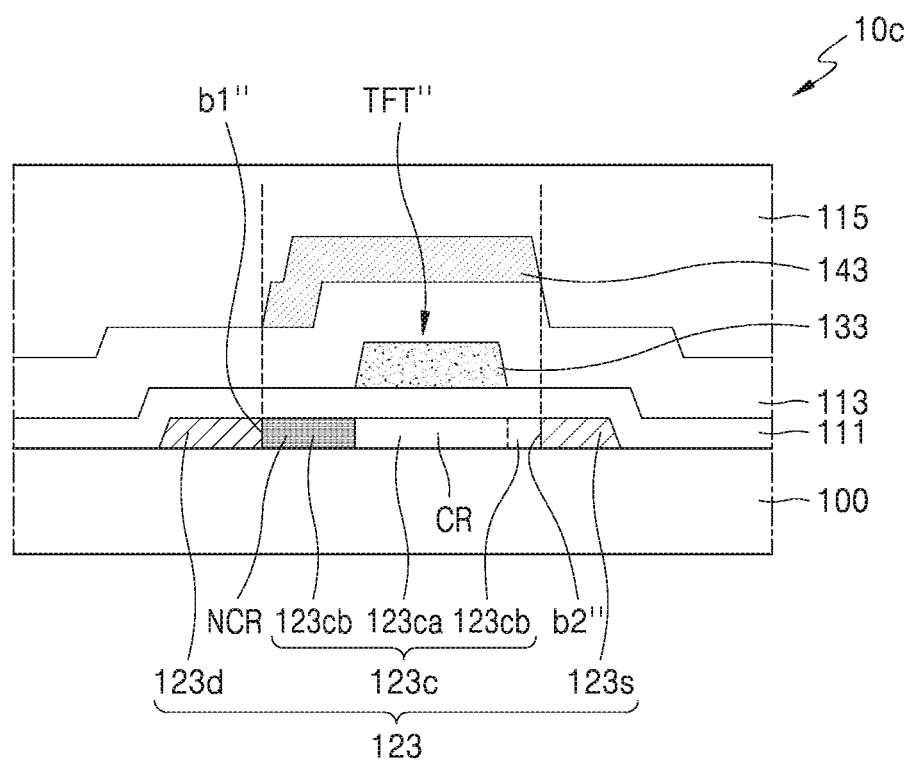
FIG. 5 is a cross-sectional view schematically illustrating a thin-film transistor substrate according to embodiments.

FIG. 5 is a cross-sectional view schematically illustrating a thin-film transistor substrate 10c according to embodiments. The same reference numerals of FIG. 5 as those of FIGS. 1A and 1B refer to the same elements and thus, a redundant description of the same elements will be omitted.

Referring to FIG. 5, the thin-film transistor substrate 10c may include a substrate 100 and a thin-film transistor TFT'' on the substrate 100.

The thin-film transistor TFT'' may be arranged on the substrate 100. The thin-film transistor TFT'' may include a semiconductor layer 123 on which a channel is formed, a lower electrode 133 configured to apply an electric field so that the channel may be formed, and a first gate insulating layer 111 between the semiconductor layer 123 and the lower electrode 133. An upper electrode 143 may be arranged on the thin-film transistor TFT''.

The semiconductor layer 123 of the thin-film transistor TFT'' may correspond to the semiconductor layer 120 of the thin-film transistor TFT shown in FIG. 1B, the lower electrode 133 of the thin-film transistor TFT'' may correspond to the lower electrode 130 of the thin-film transistor TFT shown in FIG. 1B, and the upper electrode 143 may correspond to the upper electrode 140 shown in FIG. 1B. Thus, common features of FIG. 5 and FIGS. 1A and 1B will be replaced with the description of FIG. 1B, and a difference between the features will be described below.

The semiconductor layer 123 may include a first semiconductor region 123c in which a channel is formed, and a first conductive region 123d and a second conductive region 123s, which are at both sides of the first semiconductor region 123c.

In an embodiment, when the semiconductor layer 123 is a p-type semiconductor, the first conductive region 123d may be a drain region, and the second conductive region 123s may be a source region.

The upper electrode 143 may be arranged on the second gate insulating layer 113. At least part of the upper electrode 143 may overlap the first semiconductor region 123c.

In an embodiment, both edges of the upper electrode 143 in the channel length direction may define the channel length of the first semiconductor layer 123c. As shown in FIG. 5, a first boundary b1'' between the first conductive region 123d and the first semiconductor region 123c may coincide with an edge of the upper electrode 143. The first boundary b1'' between the first conductive region 123d and the first semiconductor region 123c may be defined by the edge of the upper electrode 143. Also, a second boundary b2'' between the second conductive region 123s and the first semiconductor region 123c may coincide with the edge of the upper electrode 143. The second boundary b2'' between the second conductive region 123s and the first semiconductor region 123c may be determined by the edge of the upper electrode 143.

Unlike in FIG. 5, one edge of the upper electrode 143 in the channel length direction and one edge of the lower electrode 133 in the channel length direction may define the channel length of the first semiconductor region 123c. That is, the first boundary b1'' between the first conductive region 123d and the first semiconductor region 123c may coincide with the edge of the upper electrode 143. The first boundary b1'' between the first conductive region 123d and the first semiconductor region 123c may be determined by the edge of the upper electrode 143. Also, the second boundary b2'' between the second conductive region 123s and the first semiconductor region 123c may coincide with an edge of the lower electrode 133. The second boundary b2'' between the first conductive region 123s and the first semiconductor region 123c may be determined by the edge of the lower electrode 133.

In an embodiment, the first semiconductor region 123c may include a first channel region 123ca and a second channel region 123cb. The first channel region 123ca may overlap the lower electrode 133. The first channel region 123ca may overlap the upper electrode 143. The second channel region 123cb may not overlap the lower electrode 133 but may overlap the upper electrode 143.

In an embodiment, the semiconductor layer 123 may include a non-crystallization region NCR and a crystallization region CR. The non-crystallization region NCR of the semiconductor layer 123 may include amorphous silicon (a-Si). The crystallization region CR of the semiconductor layer 123 may include polysilicon. Polysilicon may be formed by crystallizing amorphous silicon through various methods such as RTA, SPC, ELA, MIC, MILC, and SLS.

The non-crystallization region NCR may include at least part of the second channel region 123cb of the first semiconductor region 123c. For example, as shown in FIG. 5, the non-crystallization region NCR may include the second channel region 123cb to the left of the lower electrode 133 of the first semiconductor region 123c. The non-crystallization region NCR and the second channel region 123cb to the left of the lower electrode 133 may correspond to each other.

The crystallization region CR may include a region other than a region included in the non-crystallization region NCR. For example, as shown in FIG. 5, the crystallization region CR may include a first conductive region 123d, a second conductive region 123s, a first channel region 123ca of the first semiconductor region 123c, and the second channel region 123cb to the right of the lower electrode 133. The crystallization region CR, the first conductive region 123d, the second conductive region 123s, the first channel region 123ca, and the second channel region 123cb to the right of the lower electrode 133 of the first semiconductor region 123c may correspond to one another.

In other embodiments, the non-crystallization region NCR corresponding to the second channel region 123cb shown in FIG. 5 may be replaced with a low-concentration conductive region having a lower doping concentration than the first conductive region 123d. By using the lower electrode 133 as a doping mask, low-concentration doping may be performed in the second channel region 123cb, and the non-crystallization region NCR corresponding to the second channel region 123cb may be replaced with a low-concentration conductive region.

According to an embodiment, the lower electrode 133 may be arranged closer to the second conductive region 123s than the first conductive region 123d. As a result, the strength of an electric field formed between the first conductive region 123d and the lower electrode 133 may be weakened.

When the semiconductor layer 123 is a p-type semiconductor, the first conductive region 123d may be a drain region, and the second conductive region 123s may be a source region. The strength of an electric field formed between the drain region and the lower electrode 133 may be weakened, and gate induced drain leakage may be reduced. A drain leakage current caused by the lower electrode 133 may be reduced.

FIGS. 6A through 6D are cross-sectional views according to a process sequence for describing a method of manufacturing the thin-film transistor substrate 10c shown in FIG. 5, according to embodiments.

Figure 6A:
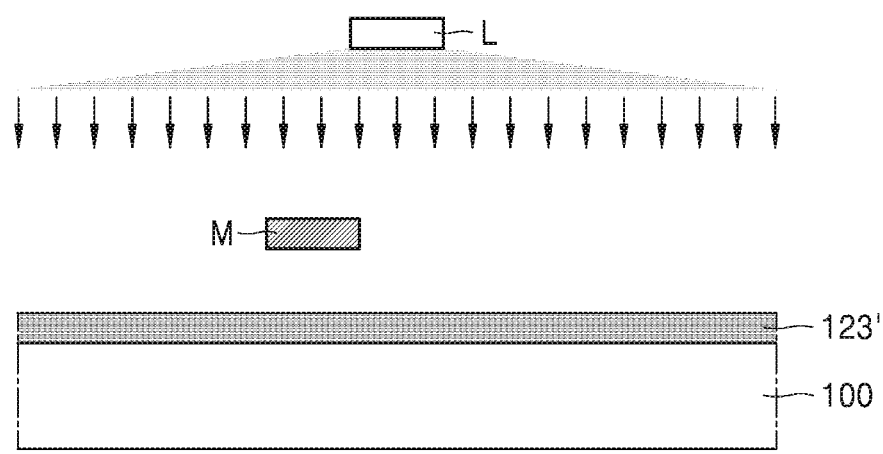
FIGS. 6A, 6B, 6C, and 6D are cross-sectional views according to a process sequence for describing a method of manufacturing the thin-film transistor substrate shown in FIG. 5, according to embodiments.

Referring to FIG. 6A, a substrate 100 and a semiconductor material layer 123' on the substrate 100 are shown.

The semiconductor material layer 123' may be an amorphous silicon layer. The semiconductor material layer 123' may be crystallized through various methods such as RTA, SPC, ELA, MIC, MILC, and SLS.

Figure 6B:
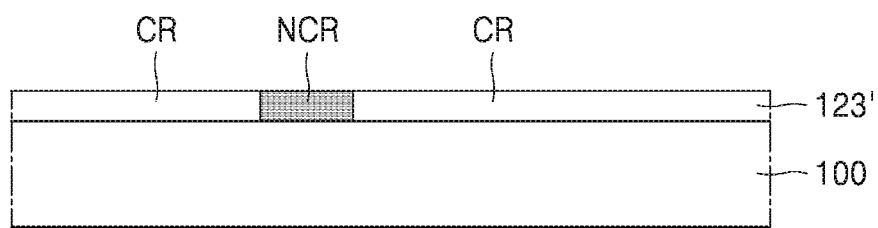

FIG. 6A illustrates a method of crystallizing the semiconductor material layer 123' through laser L. In this case, a mask M may be arranged on the semiconductor material layer 123' so that a portion of the semiconductor material layer 123' may be adjusted so as not to be crystallized. As a result, as shown in FIG. 6B, a non-crystallization region NCR may be formed in a portion of the semiconductor material layer 123' that is covered by the mask M, and a crystallization region CR may be formed in a portion of the semiconductor material layer 123' that is not covered by the mask M. The semiconductor material layer 123' may be classified into the non-crystallization region NCR and the crystallization region CR.

Thereafter, the semiconductor material layer 123' may be patterned into a semiconductor layer 123 through a photolithography process using a first mask (not shown). Also, in another example, the semiconductor material layer 123' is first patterned and then crystallized so that the semiconductor layer 123 including the non-crystallization region NCR and the crystallization region CR may also be formed.

Figure 6C:
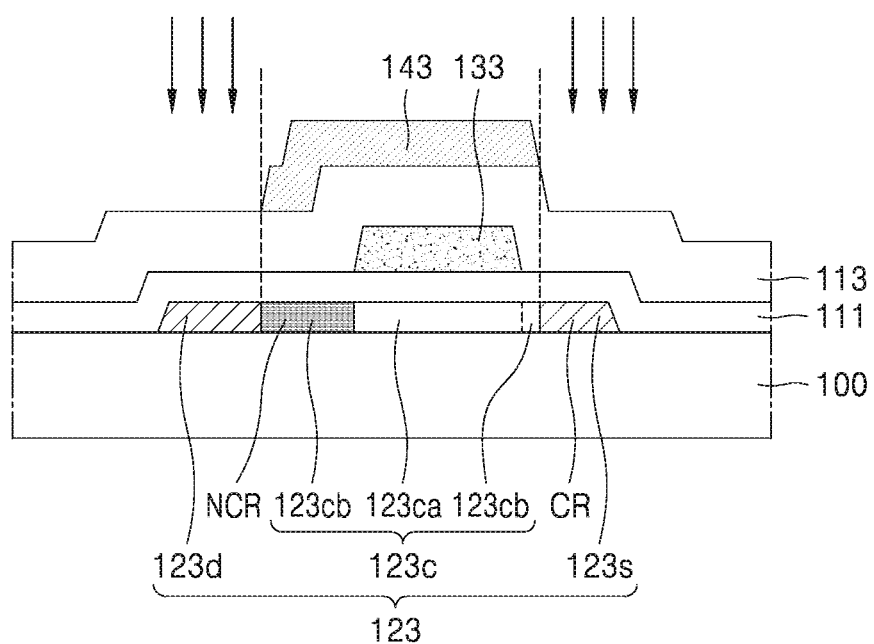

Referring to FIG. 6C, a first gate insulating layer 111 that covers the semiconductor layer 123 may be formed on the substrate 100. The first gate insulating layer 111 may include oxide, nitride, oxynitride, or a combination of oxide, nitride, oxynitride.

The lower electrode 133 at least partially overlapping the semiconductor layer 123 may be formed on the first gate insulating layer 111. Specifically, a first conductive layer (not shown) may be stacked on the first gate insulating layer 111, and the first conductive layer may be patterned into the lower electrode 133 through a photolithography process and an etching process using a second mask (not shown).

Thereafter, a second gate insulating layer 113 that covers the lower electrode 133 may be formed on the first gate insulating layer 111. The second gate insulating layer 113 may include oxide, nitride, oxynitride, or a combination of oxide, nitride, oxynitride. The second gate insulating layer 113 may be formed of the same material as the first gate insulating layer 111. In another example, the second gate insulating layer 113 may be formed of a different material from the first gate insulating layer 111.

An upper electrode 143 that overlaps the semiconductor layer 123 may be formed on the second gate insulating layer 113. Specifically, a second conductive layer (not shown) may be stacked on the second gate insulating layer 113, and the second conductive layer may be patterned into the upper electrode 143 through a photolithography process and an etching process using a third mask (not shown).

Thereafter, an ion implantation process using the upper electrode 143 as a doping mask may be performed. Impurity ions may be injected into a portion of the semiconductor layer 123 that is not covered by the upper electrode 143. As a result, a first semiconductor region 123c may be formed in a portion of the semiconductor layer 123 that is covered by the upper electrode 143, and a first conductive region 123d and a second conductive region 123s may be formed in a portion of the semiconductor layer 123 that is not covered by the upper electrode 143. The semiconductor layer 123 may be classified into a first semiconductor region 123c, a first conductive region 123d, and a second conductive region 123s.

In FIG. 6C, since the lower electrode 133 overlaps the upper electrode 143 in a channel length direction of the semiconductor layer 123, only the upper electrode 143 is used as a doping mask. In another example, as shown in FIGS. 3A and 3B, part of the lower electrode 133 may overlap the upper electrode 143, and the lower electrode 133 and the upper electrode 143 may be used as a doping mask.

A portion of the first semiconductor region 123c into which impurity ions are not injected, may include the non-crystallization region NCR. As shown in FIG. 6C, a second channel region 123cb to the left of the lower electrode 133 of the first semiconductor region 123c that does not overlap the lower electrode 133 may include the non-crystallization region NCR. In another example, the position of the non-crystallization region NCR may vary according to a position where the lower electrode 133 and the upper electrode 143 shown in FIG. 6C are formed. This will be described below with reference to FIGS. 7A through 7D.

Figure 6D:
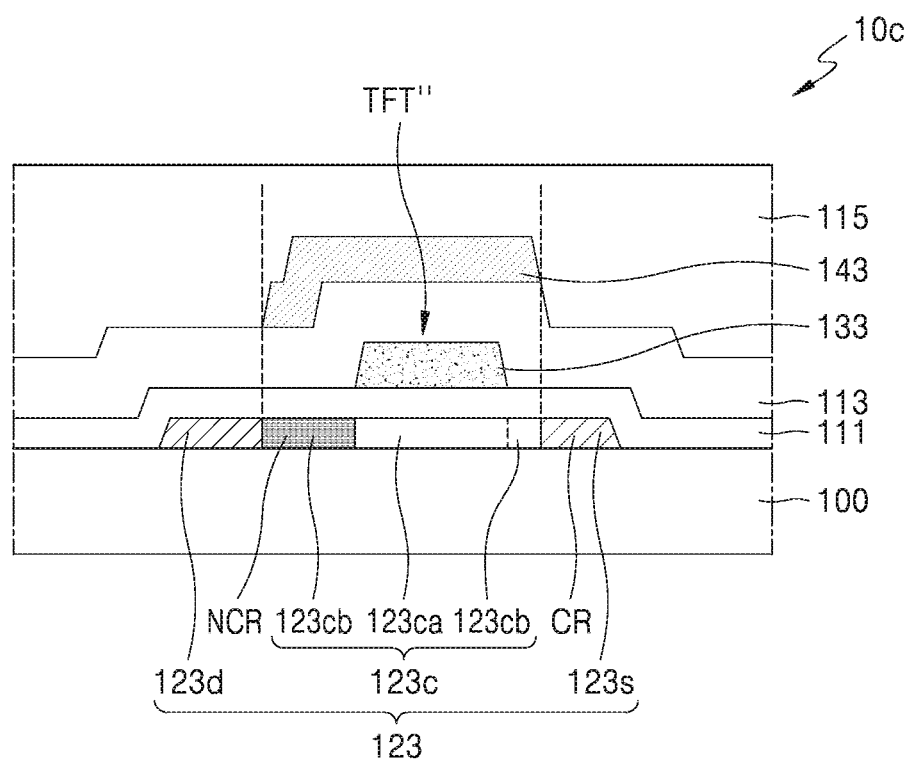

Referring to FIG. 6D, an interlayer insulating layer 115 that covers the upper electrode 140 may be formed on the second gate insulating layer 113.

FIGS. 7A through 7D are cross-sectional views schematically illustrating a thin-film transistor substrate according to embodiments. The same reference numerals of FIGS. 7A through 7D as those of FIG. 5 represent the same elements and thus, a redundant description of the same elements will be omitted.

Referring to FIGS. 7A through 7D, the semiconductor layer 123 may include the non-crystallization region NCR and the crystallization region CR. The non-crystallization region NCR of the semiconductor layer 123 may include amorphous silicon (a-Si). The crystallization region CR of the semiconductor layer 123 may include polysilicon. Polysilicon may be formed by crystallizing amorphous silicon through various methods such as RTA, SPC, ELA, MIC, MILC, and SLS.

Figure 7A:
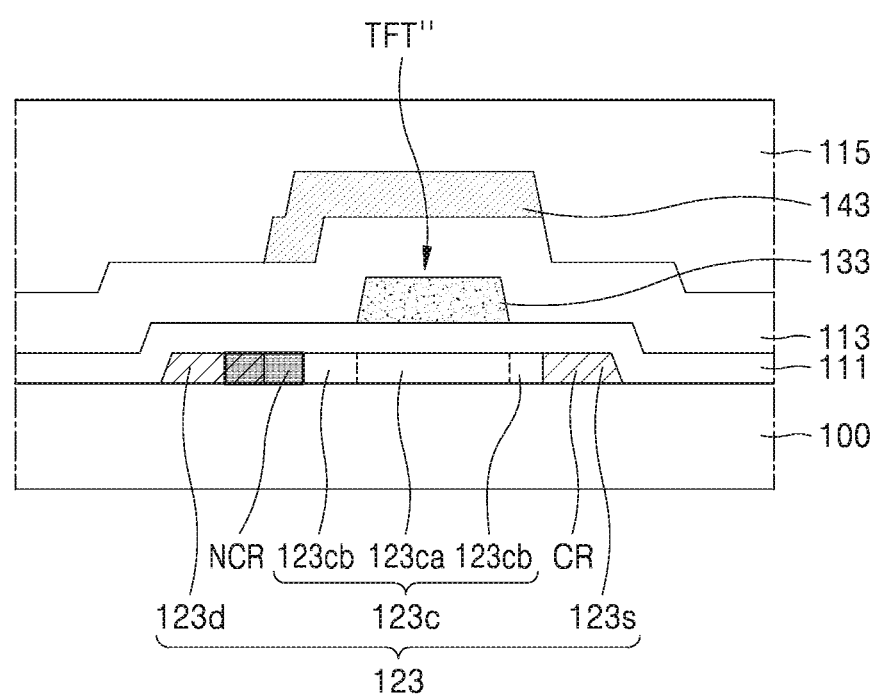
FIGS. 7A, 7B, 7C, and 7D are cross-sectional views schematically illustrating a thin-film transistor substrate according to embodiments.

In an embodiment, as shown in FIG. 7A, the non-crystallization region NCR may include part of the first conductive region 123d and part of the second channel region 123cb. The non-crystallization region CR may include a region other than the region included in the non-crystallization region NCR. For example, the crystallization region CR may include part of the first conductive region 123d, part of the second channel region 123cb, the second conductive region 123s, and the first channel region 123ca.

Figure 7B:
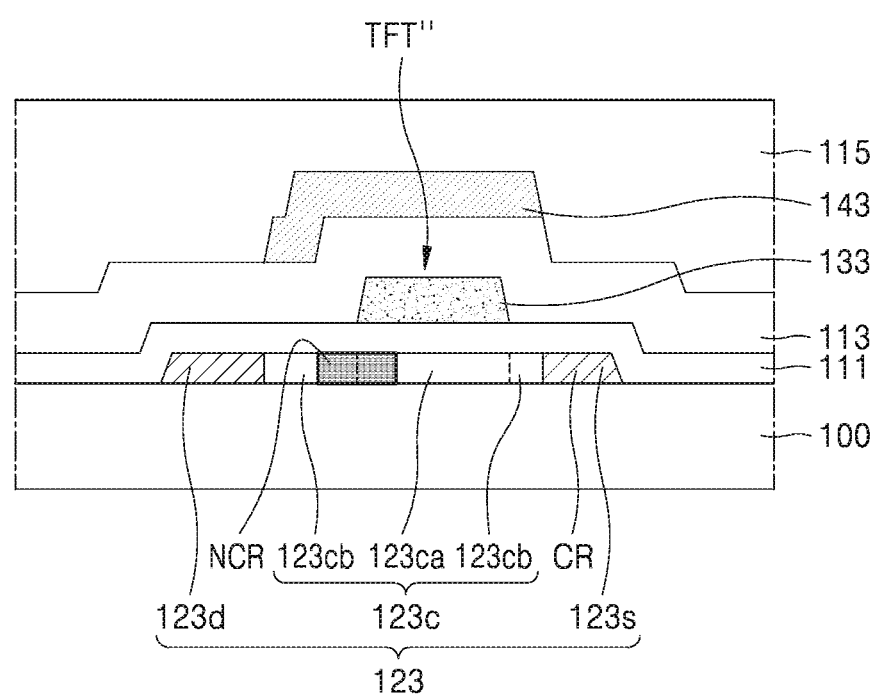

In an embodiment, as shown in FIG. 7B, the non-crystallization region NCR may include part of the first channel region 123ca and part of the second channel region 123cb. The crystallization region CR may include a region other than the region included in the non-crystallization region NCR. For example, the crystallization region CR may include the first conductive region 123d, part of the first channel region 123ca, part of the second channel region 123cb, and the second conductive region 123s.

Figure 7C:
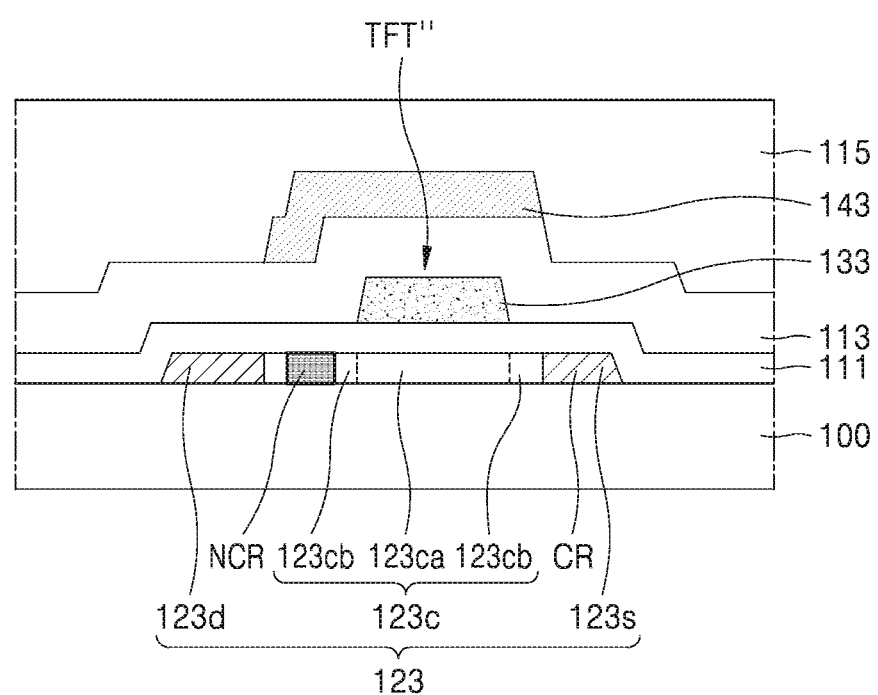

In an embodiment, as shown in FIG. 7C, the non-crystallization region NCR may include only part of the second channel region 123cb. The crystallization region CR may include the region other than the region included in the non-crystallization region NCR. For example, the crystallization region CR may include the first conductive region 123d, the first channel region 123ca, part of the second channel region 123cb, and the second conductive region 123s.

Figure 7D:
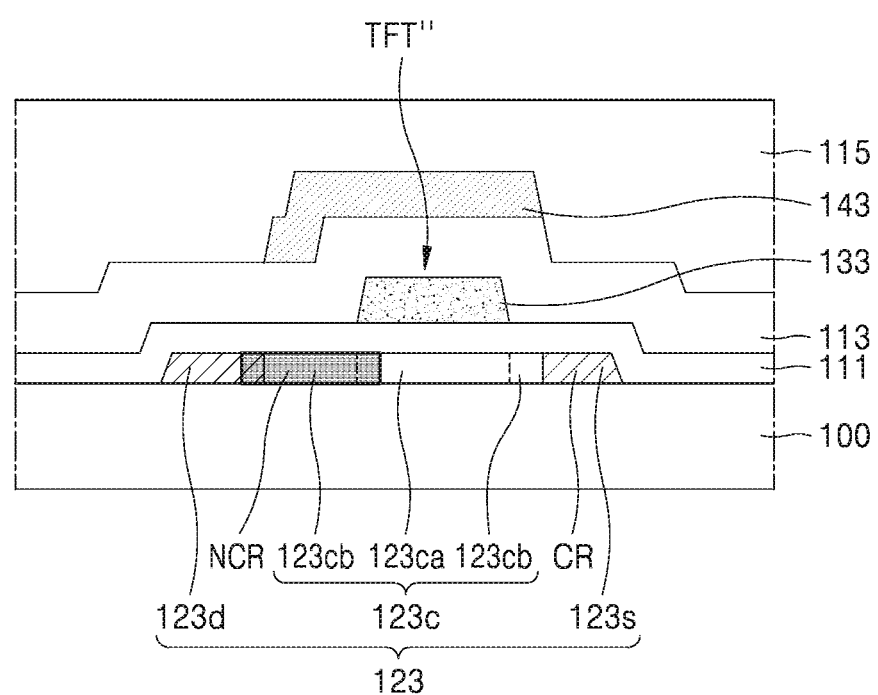

In an embodiment, as shown in FIG. 7D, the non-crystallization region NCR may include part of the first conductive region 123d, part of the first channel region 123ca, and part of the second channel region 123cb. The crystallization region CR may include a region other than the region included in the non-crystallization region NCR. For example, the crystallization region CR may include part of the first conductive region 123d, part of the first channel region 123ca, and the second conductive region 123s.

FIG. 8 is a plan view schematically illustrating a display apparatus 1 according to embodiments.

Referring to FIG. 8, the display apparatus 1 may include a display area DA in which an image is realized, and a peripheral area PA around the display area DA. The display apparatus 1 may provide an image to the outside by using light emitted from the display area DA.

The substrate 100 may include various materials such as glass, metal, or plastic. In an embodiment, the substrate 100 may include a flexible material. Here, the substrate 100 formed of the flexible material refers to a substrate that is flexible, bent, foldable or rollable. The substrate 100 formed of the flexible material may be made of ultra-thin glass, metal, or plastic.

Pixels PX including various display elements including an organic light-emitting diode (OLED) may be arranged in the display area DA of the substrate 100. A plurality of pixels PX may be provided. The plurality of pixels PX may be structured in various forms such as a stripe structure, a pentile structure, a mosaic structure, and the like, so as to realize an image.

When viewing the display area DA in a planar shape, the display area DA may be provided in a rectangular shape, as shown in FIG. 8. In an embodiment, the display area DA may be provided in a polygonal shape such as a triangle, a pentagon, a hexagon, or a circular shape, an oval shape, an irregular shape, or the like.

The peripheral area PA of the substrate 100 that is an area around the display area DA may be an area in which no image is displayed. Various wirings for transmitting an electrical signal to be applied to the display area DA and pads to which a printed circuit board or driver integrated circuit (IC) chip is attached, may be positioned in the peripheral area PA.

Figure 9:
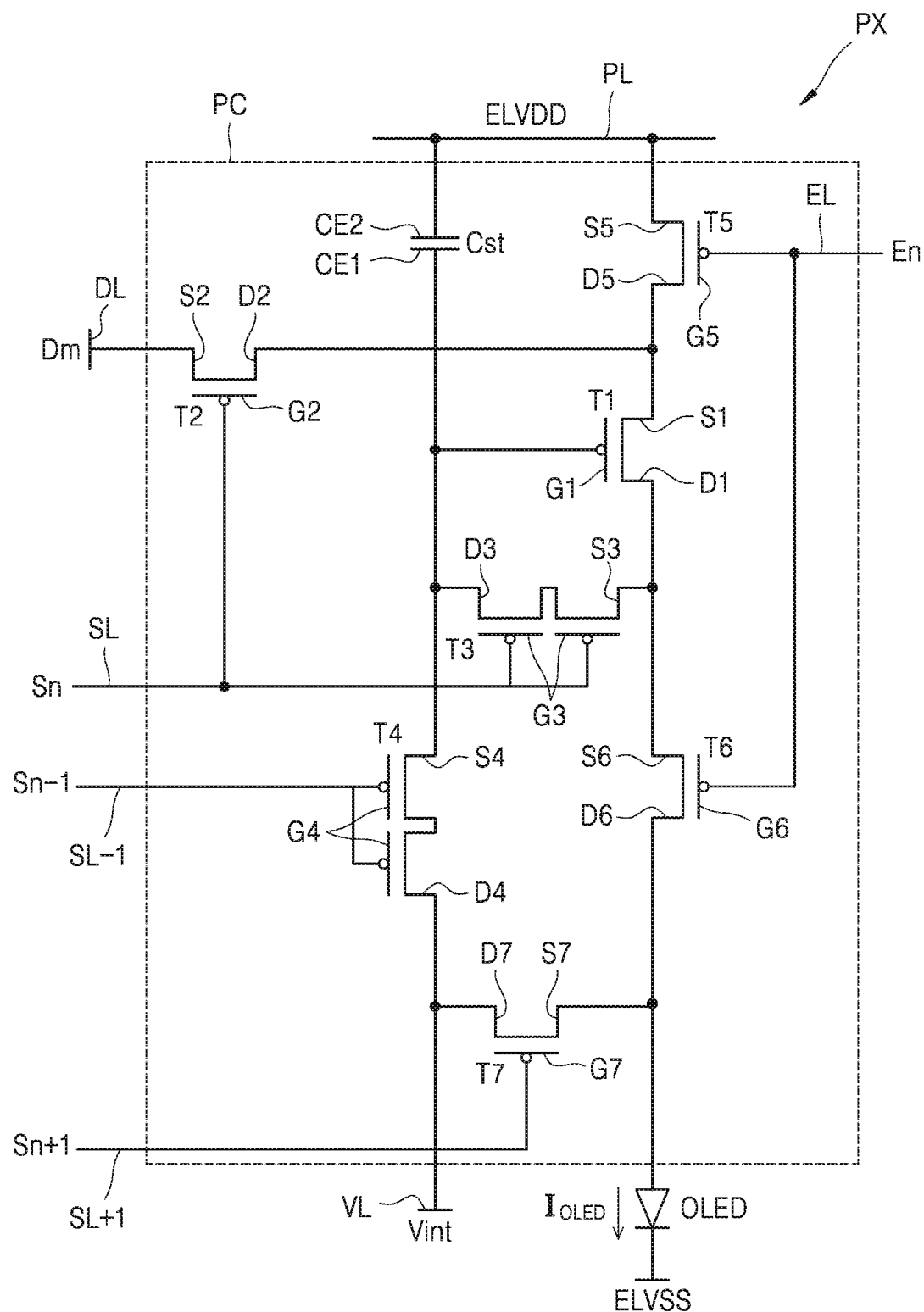
FIG. 9 is an equivalent circuit diagram of one pixel of a display apparatus according to embodiments.

FIG. 9 is an equivalent circuit diagram of one pixel PX of a display apparatus according to various embodiments.

Referring to FIG. 9, one pixel PX may include a pixel circuit PC and an organic light-emitting diode OLED electrically connected to the pixel circuit PC.

In an example, the pixel circuit PC may include first through seventh thin-film transistors T1 through T7 and a capacitor Cst, as shown in FIG. 9. The first through seventh thin-film transistors T1 through T7 and the capacitor Cst may be connected to first through third scan lines SL, SL−1, and SL+1 configured to transmit each of first through third scan signals Sn, Sn−1 and Sn+1, a data line DL configured to transmit a data voltage Dm, an emission control line EL configured to transmit an emission control signal En, a driving voltage line PL configured to transmit a driving voltage ELVDD, an initialization voltage line VL configured to transmit an initialization voltage Vint, and a common electrode to which a common voltage ELVSS is applied.

The first thin-film transistor T1 may be a driving transistor in which the magnitude of a drain voltage is determined according to a gate-source voltage, and the second through seventh thin-film transistors T2 through T7 may be switching transistors that are turned on/off according to a gate-source voltage, substantially a gate voltage.

The first thin-film transistor T1 may be referred to as a driving thin-film transistor. The second thin-film transistor T2 may be referred to as a scan thin-film transistor. The third thin-film transistor T3 may be referred to a compensation thin-film transistor. The fourth thin-film transistor T4 may be referred to as a gate initialization thin-film transistor. The fifth thin-film transistor T5 may be referred to as a first emission control thin-film transistor. The sixth thin-film transistor T6 may be referred to as a second emission control thin-film transistor. The seventh thin-film transistor T7 may be referred to as an anode initialization thin-film transistor.

The capacitor Cst may be connected between the driving voltage line PL and a driving gate G1 of the driving thin-film transistor T1. The capacitor Cst may have an upper electrode CE2 connected to the driving voltage line PL and a lower electrode CE1 connected to the driving gate G1 of the driving thin-film transistor T1.

The driving thin-film transistor T1 may control the magnitude of a driving current $I_{OLED}$ flowing through the organic light-emitting diode OLED from the driving voltage line PL according to the gate-source voltage. The driving thin-film transistor T1 may have the driving gate G1 connected to the lower electrode CE1 of the capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may be configured to output the driving current $I_{OLED}$ to the organic light-emitting diode OLED according to the gate-source voltage. The magnitude of the driving current $I_{OLED}$ may be determined based on a difference between the gate-source voltage and a threshold voltage of the driving thin-film transistor T1. The organic light-emitting diode OLED may receive the driving current $I_{OLED}$ from the driving thin-film transistor T1 and may emit light with brightness according to the magnitude of the driving current $I_{OLED}$.

The scan thin-film transistor T2 may be configured to transmit a data voltage Dm to the driving source S1 of the driving thin-film transistor T1 in response to a first scan signal Sn. The scan thin-film transistor T2 may have a scan gate G2 connected to the first scan line SL, a scan source S2 connected to the data line DL, and a scan drain D2 connected to the driving source S1 of the driving thin-film transistor T1.

The compensation thin-film transistor T3 may be serially connected between the driving drain D1 and the driving gate G1 of the driving thin-film transistor T1 and may connect the driving drain D1 to the driving gate G1 of the driving thin-film transistor T1 in response to the first scan signal Sn. The compensation thin-film transistor T3 may have a compensation gate G3 connected to the first scan line SL, a compensation source S3 connected to the driving drain D1 of the driving thin-film transistor T1, and a compensation drain D3 connected to the driving gate G1 of the driving thin-film transistor T1. In FIG. 9, the compensation thin-film transistor T3 includes two thin-film transistors serially connected to each other. However, the compensation thin-film transistor T3 may include one thin-film transistor.

The gate initialization thin-film transistor T4 may be configured to apply the initialization voltage Vint to the driving gate G1 of the driving thin-film transistor T1 in response to the second scan signal Sn−1. The gate initialization thin-film transistor T4 may have a first initialization gate G4 connected to the second scan line SL−1, a first initialization source S4 connected to the driving gate G1 of the driving thin-film transistor T1, and a first initialization drain D4 connected to the initialization voltage line VL. In FIG. 9, the gate initialization thin-film transistor T4 includes two thin-film transistors serially connected to each other. However, the gate initialization thin-film transistor T4 may include one thin-film transistor.

The anode initialization thin-film transistor T7 may be configured to apply the initialization voltage Vint to an anode of the organic light-emitting diode OLED in response to the third scan signal Sn+1. The anode initialization thin-film transistor T7 may have a second initialization gate G7 connected to the third scan line SL+1, a second initialization source S7 connected to an anode of the organic light-emitting diode OLED, and a second initialization drain D7 connected to the initialization voltage line VL.

The first emission control thin-film transistor T5 may be configured to connect the driving voltage line PL to the driving source S1 of the driving thin-film transistor T1 in response to the emission control signal En. The first emission control thin-film transistor T5 may have a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may be configured to connect the driving drain D1 of the driving thin-film transistor T1 to the anode of the organic light-emitting diode OLED in response to the emission control signal En. The second emission control thin-film transistor T6 may have a second emission control gate G6 connected to the emission control line EL, a second emission control source S6 connected to the driving drain D1 of the driving thin-film transistor T1, and a second emission control drain D6 connected to the anode of the organic light-emitting diode OLED.

The second scan signal Sn−1 may be substantially synchronized with the first scan signal Sn in a previous row. The third scan signal Sn+1 may be substantially synchronized with the first scan signal Sn. In another example, the third scan signal Sn+1 may be substantially synchronized with the first scan signal Sn in a next row.

In the present embodiment, the first through seventh thin-film transistors T1 through T7 may include a semiconductor layer including silicon. In an example, each of the first through seventh thin-film transistors T1 through T7 may include a semiconductor layer including low temperature poly-silicon (LTPS). The polysilicon material has high electron mobility, e.g., 100 cm$^2$/Vs or more, low energy consumption and excellent reliability. In another example, the semiconductor layers of the first through seventh thin-film transistors T1 through T7 may include oxide including at least one material selected from the group consisting of In, Ga, Sn, Zr, V, Hf, Cd, Ge, Cr, Ti, Al, Cs, Ce, and Zn. For example, the semiconductor layer A may be an InSnZnO (ITZO) semiconductor layer, an InGaZnO (IGZO) semiconductor layer, or the like. In another example, some semiconductor layers of the first through seventh thin-film transistors T1 through T7 may be formed of LTPS, and the other semiconductor layers of the first through seventh thin-film transistors T1 through T7 may be formed of an oxide semiconductor (IGZO, etc.).

Hereinafter, a specific operation process of one pixel PX of the display apparatus 1 according to an embodiment will be described in detail. As shown in FIG. 9, it is assumed that the first through seventh thin-film transistors T1 through T7 are p-type metal oxide semiconductor field-effect transistors (MOSFETs).

First, when an emission control signal En at a high level is received, the first emission control thin-film transistor T5 and the second emission control thin-film transistor T6 may be turned off, and the driving thin-film transistor T1 may stop an output of the driving current $I_{OLED}$, and the organic light-emitting diode OLED may stop emission.

Thereafter, during a gate initialization period in which the second scan signal Sn−1 at a low level is received, the gate initialization thin-film transistor T4 may be turned on, and the initialization voltage Vint may be applied to the driving gate G1 of the driving thin-film transistor T1, i.e., the lower electrode CE1 of the capacitor Cst. A difference (ELVDD−Vint) between the driving voltage ELVDD and the initialization voltage Vint may be stored in the capacitor Cst.

Thereafter, during a data writing period in which the first scan signal Sn at a low level is received, the scan thin-film transistor T2 and the compensation thin-film transistor T3 may be turned on, and the data voltage Dm may be received by the driving source S1 of the driving thin-film transistor T1. By using the compensation thin-film transistor T3, the driving thin-film transistor T1 may be diode-connected and biased in a forward direction. A gate voltage of the driving thin-film transistor T1 may rise at the initialization voltage Vint. When the gate voltage of the driving thin-film transistor T1 is equal to a data compensation voltage (Dm−|Vth|) in which the data voltage Dm is reduced by a threshold voltage Vth of the driving thin-film transistor T1, the driving thin-film transistor T1 may be turned off, and rising of the gate voltage of the driving thin-film transistor T1 may be stopped. Thus, a difference (ELVDD−Dm+|Vth|) between the driving voltage ELVDD and the data compensation voltage (Dm−|Vth|) may be stored in the capacitor Cst.

In addition, during an anode initialization period in which the third scan signal Sn+1 at a low level is received, the anode initialization thin-film transistor T7 may be turned on, and the initialization voltage Vint may be applied to the anode of the organic light-emitting diode OLED. The organic light-emitting diode OLED may not emit light completely by applying the initialization voltage Vint to the anode of the organic light-emitting diode OLED, so that, although the pixel PX receives the data voltage Dm corresponding to black gradation in a next frame, a phenomenon that the organic light-emitting diode OLED emits light finely may be eliminated.

The first scan signal Sn and the third scan signal Sn+1 may be substantially synchronized with each other. In this case, the data writing period and the anode initialization period may be the same period.

Thereafter, when the emission control signal En at a low level is received, the first emission control thin-film transistor T5 and the second emission control thin-film transistor T6 may be turned on, and the driving thin-film transistor T1 may output the driving current $I_{OLED}$ corresponding to a voltage stored in the capacitor Cst, i.e., a voltage (ELVDD−Dm) in which the threshold voltage Vth of the driving thin-film transistor T1 is subtracted from the source-gate voltage (ELVDD−Dm+|Vth|) of the driving thin-film transistor T1, and the organic light-emitting diode OLED may emit light with luminance corresponding to the magnitude of the driving current $I_{OLED}$.

Although the operation process of one pixel PX of the display apparatus 1 has been described on the assumption that the first through seventh thin-film transistors T1 through T7 are p-type MOSFETs, in another example, part of the first through seventh thin-film transistors T1 through T7 may be formed as p-type MOSFETs, and the other part of the first through seventh thin-film transistors T1 through T7 may be formed as n-type MOSFETs.

In FIG. 9, the pixel circuit PC includes seven thin-film transistors and one capacitor. However, the pixel circuit PC may include two thin-film transistors and one capacitor. In another example, the pixel circuit PC may include three or more thin-film transistors and/or two or more capacitors.

Figure 10:
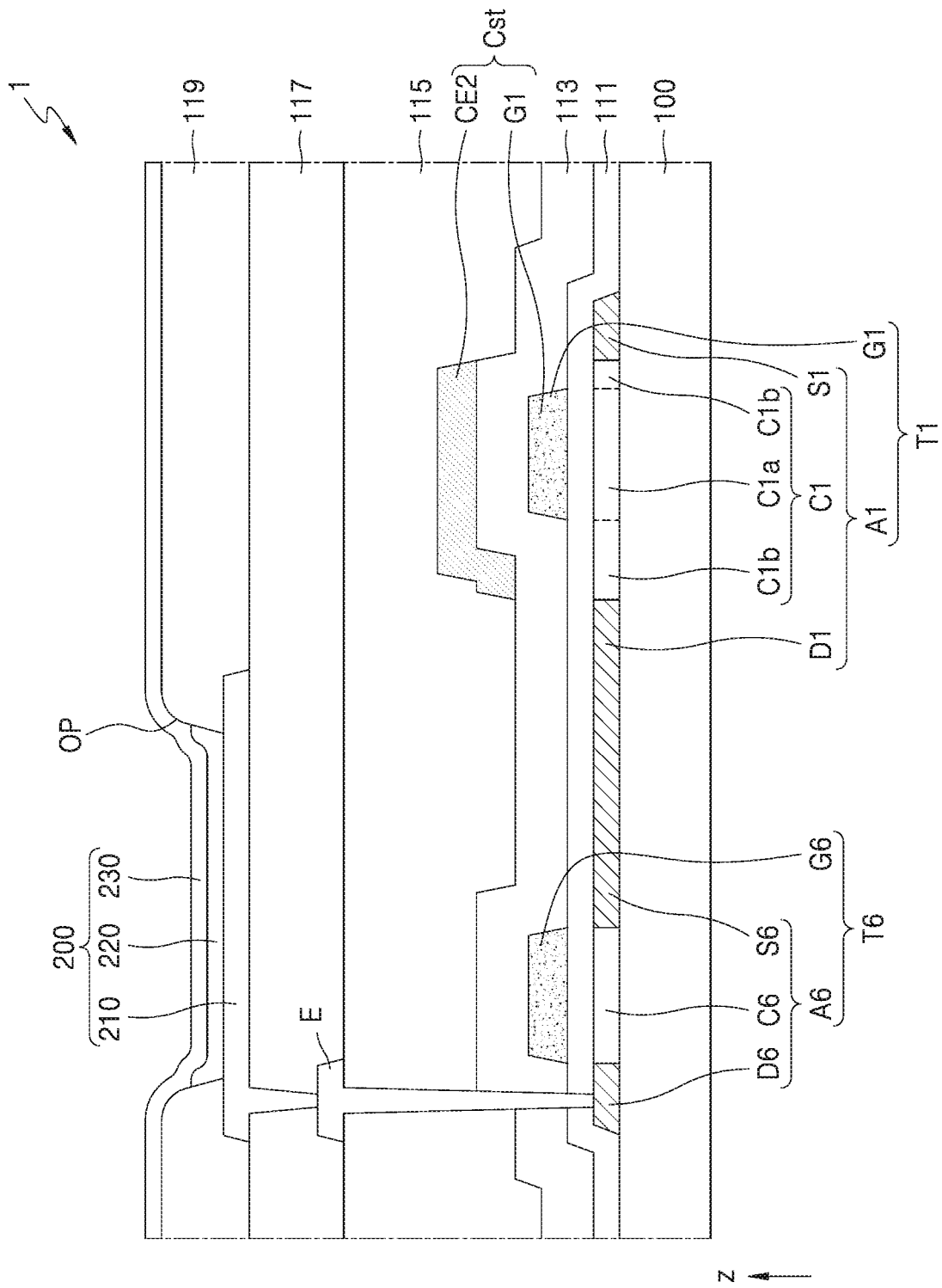
FIG. 10 is a cross-sectional view schematically illustrating a display apparatus according to embodiments.

FIG. 10 is a cross-sectional view schematically illustrating a display apparatus according to embodiments. Some elements may be omitted in FIG. 10. Also, the same reference numerals of FIG. 10 as those of FIGS. 1 and 1B represent the same elements and thus, a redundant description of the same elements will be omitted.

Referring to FIG. 10, the display apparatus 1 may include a driving thin-film transistor T1, a storage capacitor Cst, a second emission control thin-film transistor T6, and a display element 200.

The driving thin-film transistor T1 and the second emission control thin-film transistor T6 may be arranged on the substrate 100. An upper electrode CE2 may be arranged on the driving thin-film transistor T1, and a driving gate electrode G1 and the upper electrode CE2 may constitute a storage capacitor Cst. A first gate insulating layer 111 may be between semiconductor layers A1 and A6 and gate electrodes G1 and G6, and a second gate insulating layer 113 may be between the driving gate electrode G1 and the upper electrode CE2. The driving thin-film transistor T1, the storage capacitor Cst, and the second emission control thin-film transistor T6 may be covered by the interlayer insulating layer 115. The semiconductor layer A6 includes the semiconductor region C6.

The driving thin-film transistor T1 may correspond to the thin-film transistor TFT of FIG. 1B or the thin-film transistor TFT' of FIG. 3B, and the second emission control thin-film transistor T6 may correspond to the second thin-film transistor TFT2 of FIG. 4. The storage capacitor Cst may correspond to the capacitor Cst of FIG. 1B or the capacitor Cst' of FIG. 3B. The driving thin-film transistor T1, the storage capacitor Cst, the second emission control thin-film transistor T6, the first gate insulating layer 111, the second gate insulating layer 113, and the interlayer insulating layer 115 have been described above with reference to FIGS. 1B, 3B, and 5 and thus, will not be repeatedly described here.

An electrode layer E may be arranged on the interlayer insulating layer 115. The electrode layer E may have a single layer or multi-layer structure including at least one metal selected from the group consisting of Al, Pt, Pd, Ag, Mg, Au, Ni, Nd, Ir, Cr, Li, Ca, Mo, Ti, W, and Cu.

The electrode layer E may be connected to the semiconductor layer A6 of the second emission control thin-film transistor T6 through contact holes formed on each of the first gate insulating layer 111, the second gate insulating layer 113, and the interlayer insulating layer 115.

A planarization layer 117 may be arranged on the interlayer insulating layer 115 so as to cover the electrode layer E. The planarization layer 117 may include general-purpose polymer such as benzocyclobutene (BCB), polyimide, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, a p-xylene-based polymer, vinyl alcohol-based polymer, and a blend thereof.

A display element 200 may be arranged on the planarization layer 117. The display element 200 may include a pixel electrode 210, an intermediate layer 220 including an organic emission layer, and an opposite electrode 230. The display element 200 may be connected to the electrode layer E through a contact hole formed in the planarization layer 117 and may be connected to the second emission control thin-film transistor T6 through the electrode layer E.

The pixel electrode 210 may be a (semi-)transparent electrode or reflective electrode. In some embodiments, the pixel electrode 210 may include a reflective layer formed of Ag, Mg, Al, Pt, Pd, Au, Ni, Nd, Ir, Cr, and a compound thereof and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a triple layer. For example, the triple layer of the pixel electrode 210 may include ITO/Ag/ITO.

A pixel-defining layer 119 may be arranged on the planarization layer 117. The pixel-defining layer 119 may have an opening OP that covers an edge of the pixel electrode 210 to expose part of the pixel electrode 210. The pixel-defining layer 119 may increase a distance between the edge of the pixel electrode 210 and an opposite electrode 230 above the pixel electrode 210, thus preventing an arc etc. from occurring in the edge of the pixel electrode 210.

The pixel-defining layer 119 may be formed of one or more organic insulating materials selected from the group consisting of polyimide, polyamide, acryl resin, BCB, and phenol resin through a method such as spin coating or the like.

The intermediate layer 220 may be arranged in the opening OP defined by the pixel-defining layer 119 and may include an organic emission layer. The organic emission layer may include an organic material including a fluorescent or phosphorescent material that emits red, green, blue or white light. The organic emission layer may include a small molecular weight organic material or a polymer organic material, and a functional layer, such as a hole transport layer (HTL), a hole injection layer (HIL), an electron transport layer (ETL), or an electron injection layer (EIL) may be selectively further arranged under and on the organic emission layer.

The opposite electrode 230 may be a transparent electrode or reflective electrode. In some embodiments, the opposite electrode 230 may be a transparent or semi-transparent electrode and may be formed of a metal thin layer having a small work function and including Li, Ca, LiF/Ca, LiF/Al, Al, Ag, Mg, and a compound thereof. In addition, a transparent conductive oxide (TCO) layer such as ITO, IZO, ZnO or $In_2O_3$ may be further arranged on the metal thin layer. The opposite electrode 230 may be arranged over the display area (see DA of FIG. 8) and may be arranged on the intermediate layer 220 and above the pixel-defining layer 119. The opposite electrode 230 may be formed integrally with a plurality of display elements 200 and may correspond to the plurality of pixel electrodes 210.

Although not shown in FIG. 10, since an organic light-emitting device may be easily damaged by moisture from the outside or oxygen, a thin-film encapsulation layer may cover and protect the organic light-emitting device. The thin-film encapsulation layer may include a first inorganic encapsulation layer, an organic encapsulation layer, and a second inorganic encapsulation layer.

In an embodiment, the driving gate electrode G1 may be arranged closer to the driving source region S1 than the driving drain region D1. A separation distance between the driving drain region D1 and the driving gate electrode G1 may be greater than a separation distance between the driving source region S1 and the gate electrode G1. Thus, the strength of an electric field formed between the driving drain region D1 and the gate electrode G1 may be weakened. When the strength of an electric field formed between the driving drain region D1 and the gate electrode G1 is weakened, gate induced drain leakage may be reduced. A drain leakage current caused by the gate electrode G1 may be reduced. Thus, an off state leakage current of the driving thin-film transistor T1 may be reduced.

Figure 11:
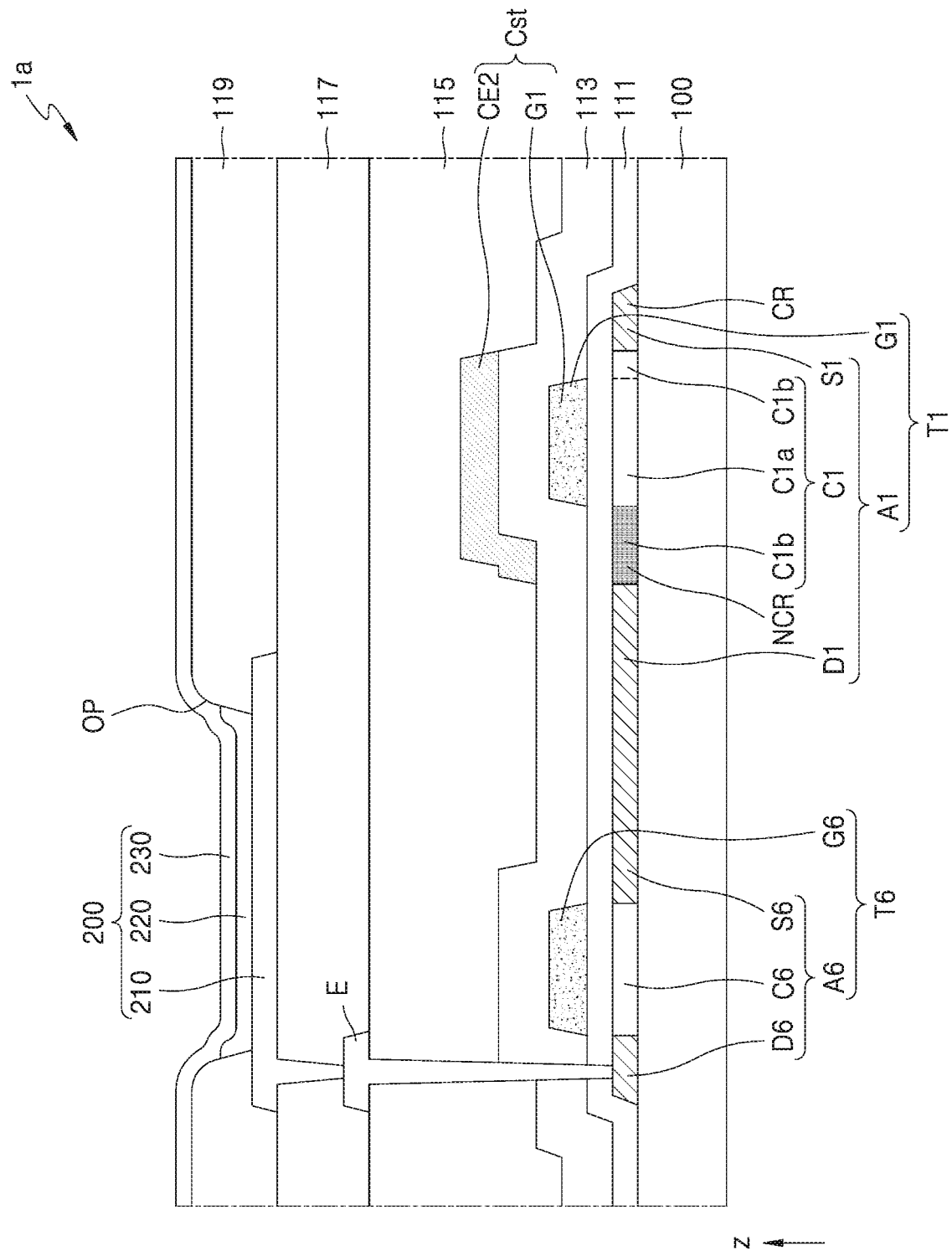
FIG. 11 is a cross-sectional view schematically illustrating a display apparatus according to embodiments.

FIG. 11 is a cross-sectional view schematically illustrating a display apparatus 1a according to embodiments. Some elements may be omitted in FIG. 11. In addition, the same reference numerals of FIG. 11 as those of FIG. 10 represent the same elements and thus, a redundant description of the same elements will be omitted.

Referring to FIG. 11, the display apparatus 1a may include a driving thin-film transistor T1, a storage capacitor Cst, a second emission control thin-film transistor T6, and a display element 200.

The driving thin-film transistor T1 and the second emission control thin-film transistor T6 may be arranged on the substrate 100. An upper electrode CE2 may be arranged on the driving thin-film transistor T1, and a driving gate electrode G1 and the upper electrode CE2 may constitute a storage capacitor Cst. A first gate insulating layer 111 may be between semiconductor layers A1 and A6 and gate electrodes G1 and G6, and a second gate insulating layer 113 may be between the driving gate electrode G1 and the upper electrode CE2. The driving thin-film transistor T1, the storage capacitor Cst, and the second emission control thin-film transistor T6 may be covered by the interlayer insulating layer 115.

The driving thin-film transistor T1 may correspond to the thin-film transistor TFT" of FIG. 5, and the second emission control thin-film transistor T6 may correspond to the second thin-film transistor TFT2 of FIG. 4. The storage capacitor Cst may correspond to the capacitor Cst of FIG. 1B or the capacitor Cst' of FIG. 3B. The driving thin-film transistor T1, the storage capacitor Cst, the second emission control thin-film transistor T6, the first gate insulating layer 111, the second gate insulating layer 113, the interlayer insulating layer 115, the planarization layer 117, and the display element 200 have been described above with reference to FIGS. 1B, 3B, 5, and 10 and thus will not repeatedly described here.

In an embodiment, the semiconductor layer A1 of the driving thin-film transistor T1 may include a non-crystallization region NCR and a crystallization region CR. The non-crystallization region NCR of the semiconductor layer A1 of the driving thin-film transistor T1 may include amorphous silicon (a-Si). The crystallization region CR of the semiconductor layer A1 of the driving thin-film transistor T1 may include polysilicon. Polysilicon may be formed by crystallizing amorphous silicon through various methods such as RTA, SPC, ELA, MIC, MILC, and SLS.

The non-crystallization region NCR may include at least part of a second channel region C1b of a first semiconductor region C1. For example, as shown in FIG. 11, the non-crystallization region NCR may include a portion of the second channel region C1b of the first semiconductor region C1. The non-crystallization region NCR and the second channel region C1b to the left of the gate electrode G1 may correspond to each other.

The crystallization region CR may include a region other than a region included in the non-crystallization region NCR. For example, as shown in FIG. 11, the crystallization region CR may include a driving drain region D1, a driving source region S1, a first channel region C1a, and a portion of the second channel region C1b of the first semiconductor region C1. The crystallization region CR, the driving drain region D1, the driving source region S1, the first channel region C1a, and a portion of the second channel region C1b of the first semiconductor region C1 may correspond to one another.

In another example, as shown in FIGS. 7A through 7D, the non-crystallization region NCR may include part of the driving drain region D1, part of the first channel region C1a, or part of the driving drain region D1 and part of the first channel region C1a.

Figure 12:
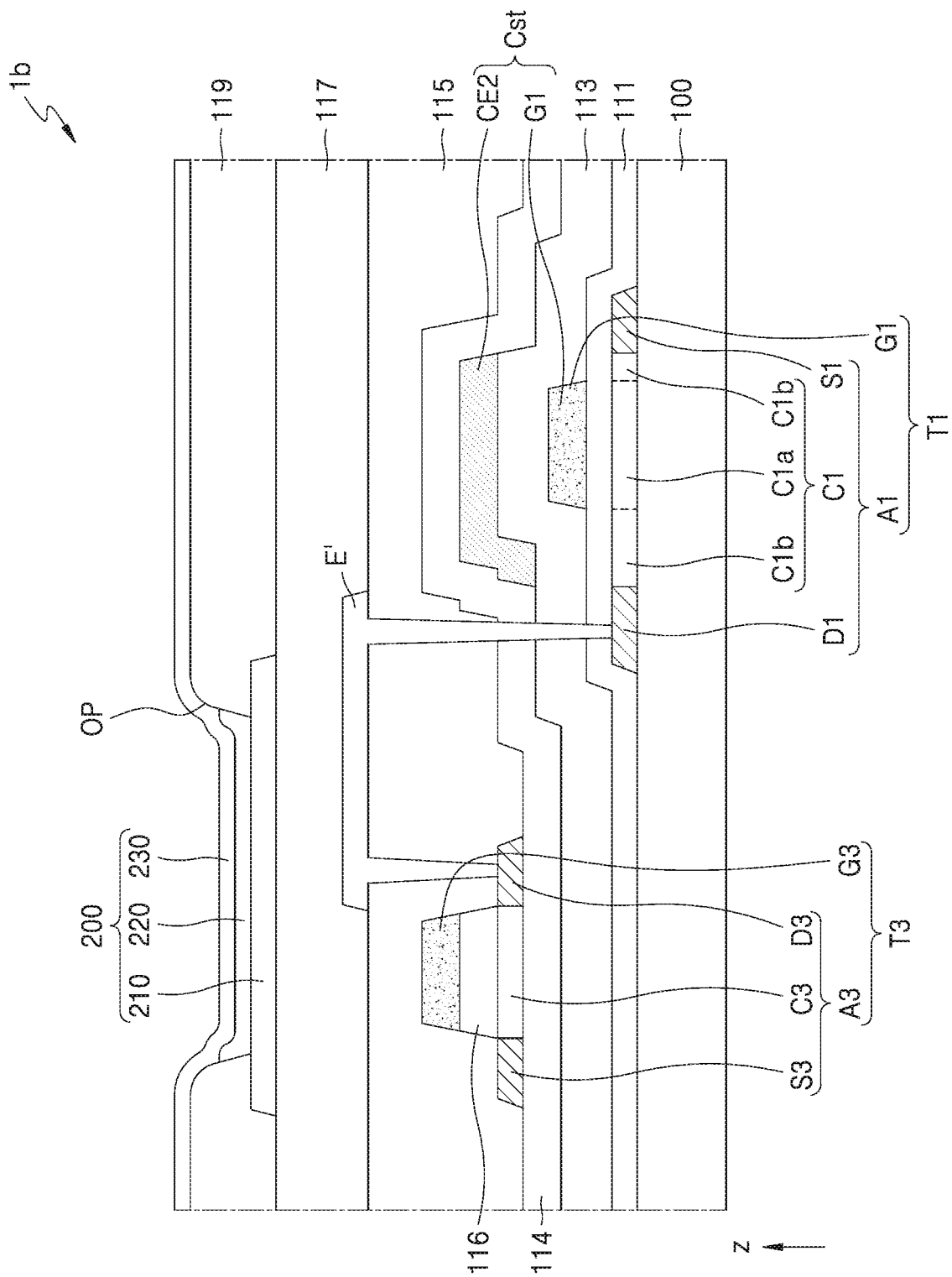
FIG. 12 is a cross-sectional view schematically illustrating a display apparatus according to embodiments.

FIG. 12 is a cross-sectional view schematically illustrating a display apparatus 1b according to embodiments. The same reference numerals of FIG. 12 as those of FIG. 10 represent the same elements and thus, a redundant description of the same elements will be omitted. Specifically, FIG. 12 illustrates a case where a pixel circuit includes both a p-type MOSFET and an n-type MOSFET.

Referring to FIG. 12, the display apparatus 1b may include a driving thin-film transistor T1, a storage capacitor Cst, a compensation thin-film transistor T3, and a display element 200.

The driving thin-film transistor T1 and the compensation thin-film transistor T3 may be arranged on the substrate 100. An upper electrode CE2 may be arranged on the driving thin-film transistor T1, and a driving gate electrode G1 and the upper electrode CE2 may constitute the storage capacitor Cst. An insulating layer 114 may be between the driving thin-film transistor T1 and the compensation thin-film transistor T3, and the compensation thin-film transistor T3 may be arranged on the insulating layer 114. The driving thin-film transistor T1, the storage capacitor Cst, and the compensation thin-film transistor T3 may be covered by the interlayer insulating layer 115.

The driving thin-film transistor T1 may correspond to the thin-film transistor TFT of FIG. 1B. In FIG. 12, the driving thin-film transistor T1 corresponds to the thin-film transistor TFT of FIG. 1B. However, the driving thin-film transistor T1 may correspond to the thin-film transistor TFT' of FIG. 3B or the thin-film transistor TFT" of FIG. 5. The storage capacitor Cst may correspond to the capacitor Cst of FIG. 1B or the capacitor Cst' of FIG. 3B. The driving thin-film transistor T1, the storage capacitor Cst, the first gate insulating layer 111, the second gate insulating layer 113, the interlayer insulating layer 115, the planarization layer 117, and the display element 200 have been described above with reference to FIGS. 1B, 3B, 5, and 10 and thus will not be repeatedly described here.

The compensation thin-film transistor T3 may include a semiconductor layer A3 and a compensation gate electrode G3.

The semiconductor layer A3 of the compensation thin-film transistor T3 may include oxide including at least one material selected from the group consisting of In, Ga, Sn, Zr, V, Hf, Cd, Ge, Cr, Ti, Al, Cs, Ce, and Zn. For example, the semiconductor layer A3 of the compensation thin-film transistor T3 may be an InSnZnO (ITZO) semiconductor layer, an InGaZnO (IGZO) semiconductor, or the like.

In an embodiment, as shown in FIG. 12, the third gate insulating layer 116 may be patterned to overlap part of the semiconductor layer A3 of the compensation thin-film transistor T3. A region in which the third gate insulating layer 116 and the semiconductor layer A3 of the compensation thin-film transistor T3, may be understood as a channel region C3. A source region S3 and a drain region D3 may undergo a process such as conductorization by plasma treatment or impurity doping. In this case, a portion of the semiconductor layer A3 of the compensation thin-film transistor T3 that overlaps the third gate insulating layer 116 may not be exposed to plasma treatment or impurity doping and thus may have different properties from those of the source region S3 and the drain region D3. That is, when plasma treatment or impurity doping is performed on the semiconductor layer A3 of the compensation thin-film transistor T3, the compensation gate electrode G3 positioned above the third gate insulating layer 116 may be used as a self-aligning mask, so that the channel region C3 that is not doped with impurities may be formed at a position overlapping the third gate insulating layer 116, and the source region S3 and the drain region D3 that are doped with impurities may be formed on both sides of the channel region C3, respectively.

In an embodiment, as if the first gate insulating layer 111 and the second gate insulating layer 113 are stacked on the substrate 100, the third gate insulating layer 116 may also be arranged to cover the semiconductor layer A3 of the compensation thin-film transistor T3.

An electrode layer E' may be arranged on the interlayer insulating layer 115. The electrode layer E' may be connected to the semiconductor layer A3 of the compensation thin-film transistor T3 through a contact hole formed in the interlayer insulating layer 115. The electrode layer E' may be connected to the semiconductor layer A1 of the driving thin-film transistor T1 through contact holes formed in the first gate insulating layer 111, the second gate insulating layer 113, the insulating layer 114, and the interlayer insulating layer 115. The electrode layer E' may serve as a bridge for connecting the semiconductor layer A3 of the compensation thin-film transistor T3 to the semiconductor layer A1 of the driving thin-film transistor T1.

In FIG. 12, the compensation thin-film transistor T3 is an n-type MOSFET. However, at least one of the first through seventh thin-film transistors (see T1 through T7 of FIG. 9) may be an n-type MOSFET.

According to an embodiment, the driving gate electrode G1 may be arranged closer to the driving source region S1 than the driving drain region D1. A separation distance between the driving drain region D1 and the driving gate electrode G1 may be greater than a separation distance between the driving source region S1 and the gate electrode G1. Thus, the strength of an electric field formed between the driving drain region D1 and the gate electrode G1 may be weakened. When the strength of the electric field formed between the driving drain region D1 and the gate electrode G1 is weakened, gate induced drain leakage may be reduced. A drain leakage current caused by the gate electrode G1 may be reduced. Thus, an off state leakage current of the driving thin-film transistor T1 may be reduced.

According to an embodiment of the present disclosure having the above-described configuration, a separation distance between a conductive region and a gate electrode of a semiconductor layer of a thin-film transistor is increased so that the strength of an electric field formed between the conductive region and the gate electrode may be weakened. Thus, a leakage current by a short channel effect or a high electron effect generated by a strong electric field may be prevented. Furthermore, since an upper electrode arranged on the gate electrode is used to increase the separation distance between the conductive region and the gate electrode, an additional mask is not required. Thus, an increase in cost may not occur.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made without departing from the spirit and scope as defined by the following claims.

What is claimed is:

1. A thin-film transistor substrate comprising:
   a substrate;
   a semiconductor layer disposed on the substrate and comprising a first conductive region, a second conductive region, and a first semiconductor region between the first conductive region and the second conductive region;

a lower electrode disposed on the semiconductor layer and at least partially overlapping the first semiconductor region; and an upper electrode disposed on the lower electrode and at least partially overlapping the first semiconductor region, wherein a first width of the first semiconductor region in a first direction is greater than a second width of the lower electrode in the first direction, in a plan view, a first boundary between the first semiconductor region and the first conductive region coincides with an edge of the upper electrode, in the plan view, a second boundary between the first semiconductor region and the second conductive region coincides with an edge of the lower electrode or an edge of the upper electrode, wherein the first semiconductor region comprises a first channel region that overlaps the lower electrode, and a second channel region that does not overlap the lower electrode but overlaps the upper electrode, wherein the semiconductor layer comprises a non-crystallization region including at least part of the second channel region, and wherein the semiconductor layer further comprises a crystallization region including the second conductive region.

2. The thin-film transistor substrate of claim 1, wherein, in the plan view, the second boundary between the first semiconductor region and the second conductive region coincides with an edge of the lower electrode, and a first separation distance between the lower electrode and the first boundary is greater than a second separation distance between the lower electrode and the second boundary.

3. The thin-film transistor substrate of claim 1, wherein, in the plan view, a first area in which the lower electrode and the first semiconductor region overlap each other is less than a second area in which the upper electrode and the first semiconductor region overlap each other.

4. The thin-film transistor substrate of claim 1, wherein the non-crystallization region comprises part of the first conductive region, part of the first channel region, or part of the first conductive region and part of the first channel region.

5. A thin-film transistor substrate comprising:

a substrate;

a semiconductor layer disposed on the substrate and comprising a first conductive region, a second conductive region, and a first semiconductor region between the first conductive region and the second conductive region;

a lower electrode disposed on the semiconductor layer and at least partially overlapping the first semiconductor region; and an upper electrode disposed on the lower electrode and at least partially overlapping the first semiconductor region, wherein a first width of the first semiconductor region in a first direction is greater than a second width of the lower electrode in the first direction, in a plan view, a first boundary between the first semiconductor region and the first conductive region coincides with an edge of the upper electrode, in the plan view, a second boundary between the first semiconductor region and the second conductive region coincides with an edge of the lower electrode or an edge of the upper electrode, wherein the first semiconductor region comprises a first channel region that overlaps the lower electrode, and a second channel region that does not overlap the lower electrode but overlaps the upper electrode, wherein the semiconductor layer comprises a non-crystallization region corresponding to at least a portion of the second channel region, wherein the semiconductor layer further comprises a crystallization region including the second conductive region, and wherein the lower electrode and the upper electrode comprise a capacitor.

6. The thin-film transistor substrate of claim 1, wherein the semiconductor layer further comprises a third conductive region, a fourth conductive region, and a second semiconductor region between the third conductive region and the fourth conductive region, and the thin-film transistor substrate further comprises a gate electrode disposed on the semiconductor layer and at least partially overlapping the second semiconductor region, and, in the plan view, a third boundary between the second semiconductor region and the third conductive region coincides with an edge of the gate electrode, and, in the plan view, a fourth boundary between the second semiconductor region and the fourth conductive region coincides with an edge of the gate electrode.

7. The thin-film transistor substrate of claim 1, wherein the semiconductor layer comprises a portion that is bent at least one or more times.

8. The thin-film transistor substrate of claim 1, further comprising a capacitor comprising the lower electrode and the upper electrode.

9. A display apparatus comprising:

a substrate;

a plurality of thin-film transistors and a capacitor disposed on the substrate; and a display element electrically connected to one of the plurality of thin-film transistors, wherein a first thin-film transistor of the plurality of thin-film transistors comprises a semiconductor layer, wherein the semiconductor layer comprises a first conductive region, a second conductive region and a first semiconductor region between the first conductive region and the second conductive region, and a lower electrode disposed on the semiconductor layer and at least partially overlapping the first semiconductor region, the capacitor comprises the lower electrode and an upper electrode disposed on the lower electrode and at least partially overlapping the first semiconductor region, a first width of the first semiconductor region in a first direction is greater than a second width of the lower electrode in the first direction, in a plan view, a first boundary between the first semiconductor region and the first conductive region coincides with an edge of the upper electrode, in the plan view, a second boundary between the first semiconductor region and the second conductive region coincides with an edge of the lower electrode or an edge of the upper electrode, wherein the first semiconductor region comprises a first channel region overlapping the lower electrode, and a second channel region that does not overlap the lower electrode but overlaps the upper electrode, wherein the semiconductor layer comprises a non-crystallization region including at least part of the second channel region, and wherein the semiconductor layer further comprises a crystallization region including the second conductive region.

10. The display apparatus of claim 9, wherein a second thin-film transistor of the plurality of thin-film transistors comprises the semiconductor layer comprising a third conductive region, a fourth conductive region and a second semiconductor region between the third conductive region and the fourth conductive region, and a gate electrode disposed on the semiconductor layer and at least partially overlapping the second semiconductor region, and, in the plan view, a third boundary between the second semiconductor region and the third conductive region coincides with an edge of the gate electrode, and, in the plan view, a fourth boundary between the second semiconductor region and the fourth conductive region coincides with an edge of the gate electrode.

11. The display apparatus of claim 9, wherein the first thin-film transistor comprises a driving thin-film transistor configured to supply a driving current to the display element.

* * * * *